United States Patent [19]

Fukushima et al.

[11] Patent Number: 4,965,766
[45] Date of Patent: Oct. 23, 1990

[54] DIGITAL INPUT/OUT CIRCUIT CAPABLE OF SENDING AND RECEIVING DATA IN DIFFERENT MODES

[75] Inventors: Tetsuyuki Fukushima; Satoru Kobayashi, both of Tokyo, Japan

[73] Assignee: NEC Corporation, Tokyo, Japan

[21] Appl. No.: 198,351

[22] Filed: May 25, 1988

[30] Foreign Application Priority Data

May 25, 1987 [JP] Japan .................................. 62-128915

[51] Int. Cl.$^5$ ................................................ G06F 13/00
[52] U.S. Cl. ............................. 364/900; 364/926.5; 364/927.93; 364/927.99; 364/933.9; 364/939.3
[58] Field of Search ... 364/200 MS File, 900 MS File

[56] References Cited

U.S. PATENT DOCUMENTS

| | | | |
|---|---|---|---|
| 4,453,229 | 6/1984 | Schaire | 464/900 |
| 4,628,446 | 12/1986 | Hoffner, II | 364/900 |
| 4,680,732 | 7/1987 | DiCenzo | 364/900 |

*Primary Examiner*—Thomas M. Heckler
*Attorney, Agent, or Firm*—Foley & Lardner, Schwartz, Jeffrey, Schwaab, Mack, Blumenthal & Evans

[57] ABSTRACT

A digital input/output circuit to be connected between an internal data bus composed of $2^n$ signal lines (n is zero or a positive integer) and $2^n$ external terminals includes an output port for outputting data from the internal data bus to the external terminals and an input port for inputting the data from the external terminal to the internal data bus. The output port comprises a scrambler receiving data of $2^n$ bits from the internal data bus and a mode signal and operating for relocating the received data in accordance with the mode signal so as to output the relocated data with each unit of $2^m$ bits (m is an integer not greater than n) indicated by the mode signal. An output circuit includes $2^n$ output buffers each having an input connected to receive directly or indirectly an output of the scrambler and an output connected to a corresponding one of the external terminals. This output circuit operates in response to the mode signal so as to make active $2^m$ output buffers of the $2^n$ output buffers in accordance with the mode signal and to make the other output buffers inactive. A data shifter is connected to the scrambler and includes data latch for latching data in accordance with the relocation pattern of the scrambler and shifting the latched data in accordance with the mode signal so that the data of $2^n$ bits is outputted with each unit of $2^m$ bits through the active buffers.

7 Claims, 14 Drawing Sheets

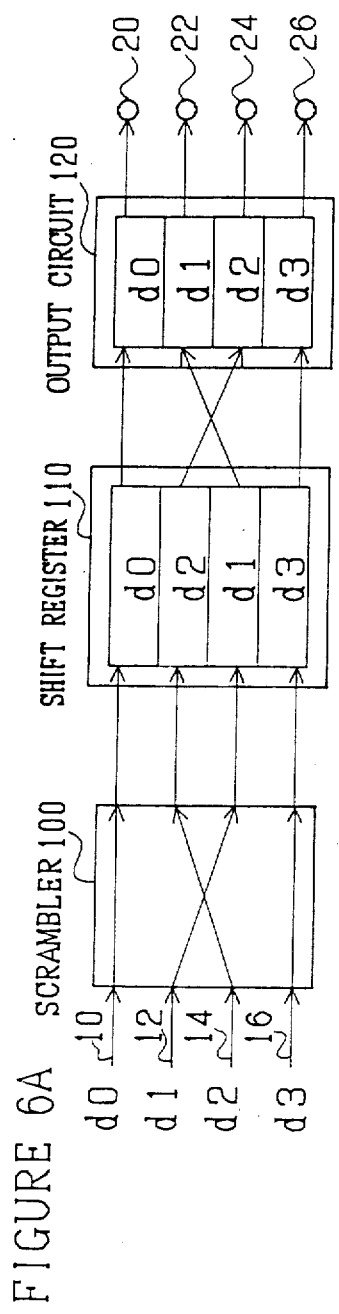
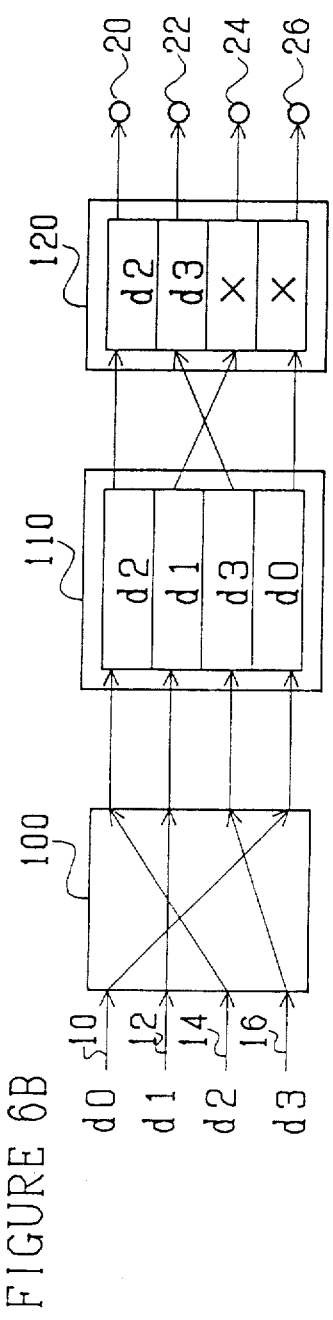
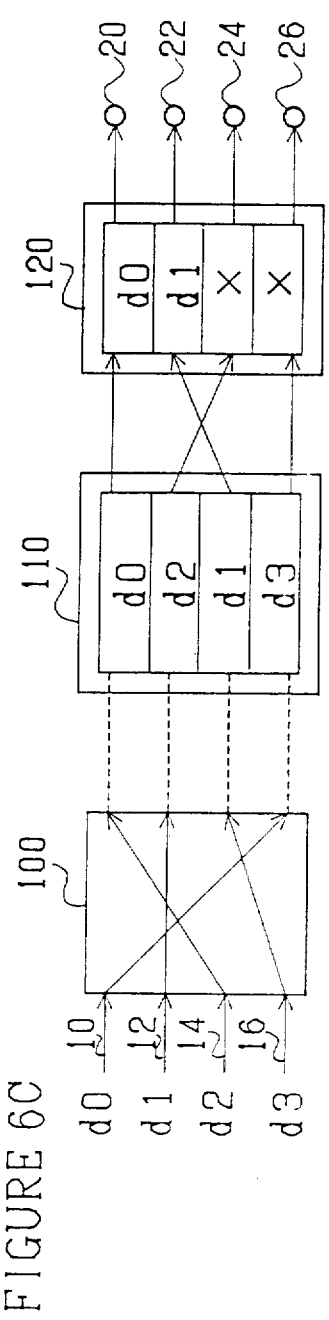

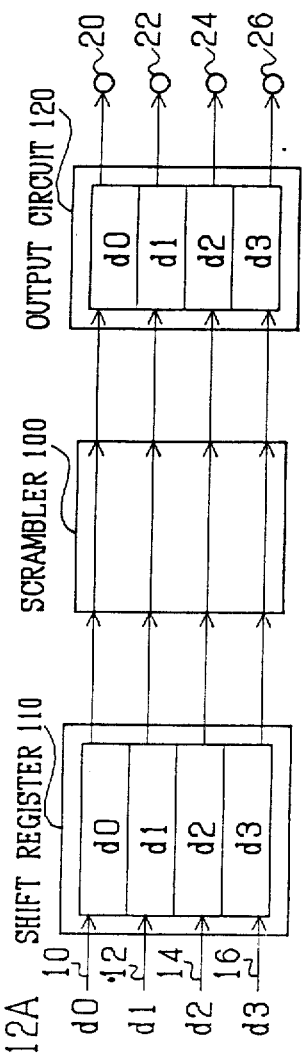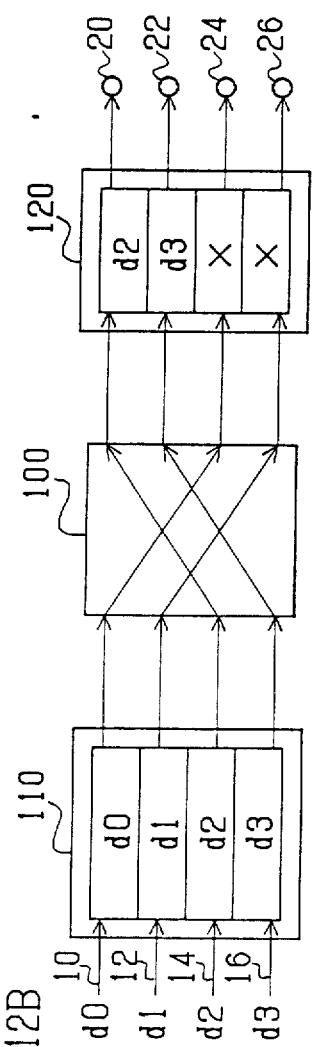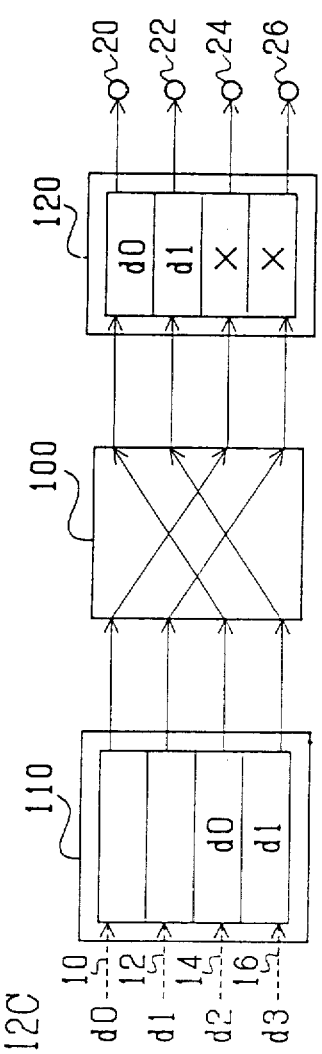

DIGITAL INPUT/OUT CIRCUIT CAPABLE OF SENDING AND RECEIVING DATA IN DIFFERENT MODES

BACKGROUND OF THE INVENTION

1. Field of the Invention

The present invention relates to a digital data input/output circuit, and more specifically to an input/output circuit for use in an input/output port of a memory and capable of sending and receiving a digital data in different formats.

2. Description of Related Art

So-called digital data input/output circuits have been used in various fields of data processings. On the other hand, the format of data processed or transferred is different in apparatuses or systems being used. For example, a serial data is handled in one field, and 4-bit parallel data is transferred in another field. Further, 2-bit parallel-serial data transmission is performed in still another field. Therefore, the input/output circuit is desired to comply with different formats or modes of data. However, conventional input/output circuits cannot handle two or more different formats or modes of data, and in addition, the input/output circuits have been complicated although the circuits can handle two different formats or modes of data.

SUMMARY OF THE INVENTION

Accordingly, it is an object of the present invention to provide an input/output circuit which has overcome the above mentioned defect of the conventional one.

Another object of the present invention is to provide a digital input/output circuit capable of freely processing the data in various modes or formats.

The above and other objects of the present invention are achieved in accordance with the present invention by a digital input/output circuit to be connected between an internal data bus composed of $2^n$ lines (n is zero or a positive integer) and $2^n$ external terminals and including an output port for outputting data from the internal data bus to the external terminals and an input port for inputting the data from the external terminal to the internal data bus.

The output port comprises:

a scrambler means receiving data of $2^n$ bits from the internal data bus and a mode signal and operating for relocating the received data in accordance with the mode signal so as to output the relocated data with each unit of $2^m$ bits (m is an integer not greater than n) indicated by the mode signal, output circuit means including $2^n$ output buffers each having an input connected to receive directly or indirectly an output of the scrambler means and an output connected to a corresponding one of the external terminals, the output circuit means operating in response to the mode signal so as to make active $2^m$ output buffers of the $2^n$ output buffers in accordance with the mode signal and to make the other output buffers inactive, and data shift means connected to the scrambler and including data latch means for latching data in accordance with the relocation pattern of the scrambler means and shifting the latched data in accordance with the mode signal so that the data of $2^n$ bits is outputted with each unit of $2^m$ bits through the active output buffers.

On the other hand, the input port includes:

input circuit means having $2^n$ input buffers connected at their inputs to the external terminals, respectively, data shift means including data latch means for directly or indirectly receiving the data outputted from the input circuit so as to latch the data of least $2^m$ bits in accordance with the mode signal, the data shift means operating to shift the latched data between the data latch means in accordance with the mode signal, and scrambler means connected to the data shift means so as to allow a data of $2^n$ bits relocated in accordance with the mode signal to be outputted to the internal data bus.

The above and other objects, features and advantages of the present invention will be apparent from the following description of preferred embodiments of the invention with reference to the accompanying drawings.

BRIEF DESCRIPTION OF THE DRAWINGS

FIGS. 6A to 6C and 7A and 7D illustrate the relation between the data on the internal signal lines and the data on the external terminals of the output port shown in FIG. 5 in different operation modes;

FIGS. 12A to 12C and 13A and 13D illustrate the relation between the data on the internal signal lines and the data on the external terminals of the output port shown in FIG. 11 in different operation modes;

DESCRIPTION OF THE PREFERRED EMBODIMENTS

Figure 1:
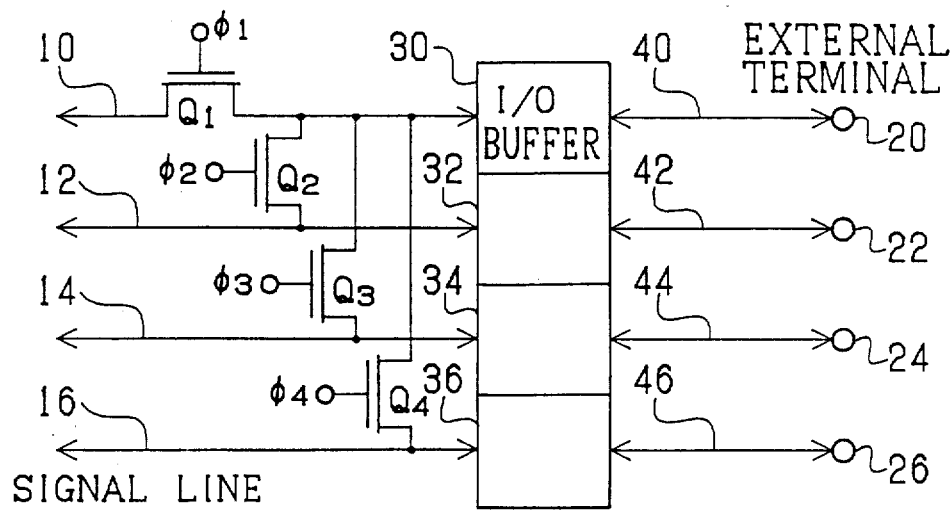
FIG. 1 is a diagram of one typical conventional digital input/output circuit of four bits.

Referring to FIG. 1, there is shown a diagram of one typical conventional digital input/output circuit of four bits. The shown circuit is connected between four signal lines 10, 12, 14 and 16 and external terminals 20, 22, 24 and 26. The signal lines 10 to 16 form an internal data bus. The input/output circuit includes a field effect transistor (called "FET" hereinafter) $Q_1$ connected at its one end to the signal line 10 and having a gate connected to receive an interleaving clock $\phi_1$, and an input/output buffer 30 connected at its one end to the other end of the transistor $Q_1$ and at its other end to the terminal 20 through an input/output signal line 40. Accordingly, when the interleaving clock $\phi_1$ is rendered active, the signal line 10 is coupled to the one end of the input/output buffer 30. The input/output circuit also includes an input/output buffer 32 connected at its one end to the signal line 12 and at its other end to the terminal 22 through an input/output signal line 42, and a FET $Q_2$ connected between the signal line 12 and a connection line between the FET $Q_1$ and the Input/output buffer 30 and having a gate connected to receive an interleaving clock $\phi_2$, so that, when the interleaving clock $\phi_2$ is rendered active, the signal line 12 is coupled not only to the one end of the input/output buffer 32 but also to the one end of the input/output buffer 30. Furthermore, an input/output buffer 34 is connected at its one end to the signal line 14 and at its other end to the terminal 24 through an input/output signal line 44, and a FET $Q_3$ is connected between the signal line 14 and the connection line between the FET $Q_1$ and the Input/output buffer 30. The FET $Q_3$ has a gate connected to receive an interleaving clock $\phi_3$, so that, when the interleaving clock $\phi_3$ is rendered active, the signal line 14 coupled to the one end of the input/output buffer 34 is also coupled to the one end of the input/output buffer 30. Similarly, an input/output buffer 36 is connected at its one end to the signal line 16 and at its other end to the terminal 26 through an input/output signal line 46, and a FET $Q_4$ is connected between the signal line 16 and the connection line between the FET $Q_1$ and the Input/output buffer 30. The FET $Q_4$ is also connected to receive at its gate an interleaving clock $\phi_4$, so that, when the interleaving clock $\phi_4$ is rendered active, the signal line 16 coupled to the one end of the input/output buffer 36 is also coupled to the one end of the input/output buffer 30.

Figure 2:
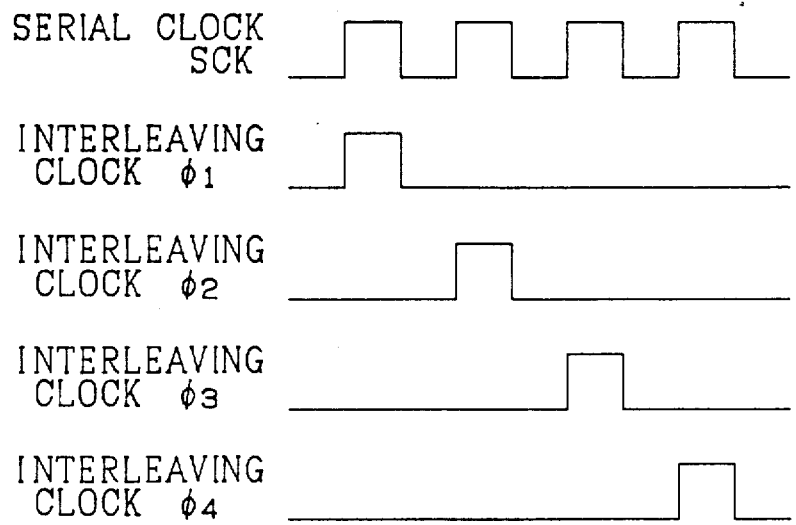
FIG. 2 is a timing chart of a serial clock SCK and four interleaving clock $\phi_1$, $\phi_2$, $\phi_3$, and $\phi_4$ derived from the serial clock SCK for driving the transfer gate transistors used in the circuit shown in FIG. 1.

Now, an operation of the above mentioned input/output circuit will be explained with reference to FIG. 2. The four interleaving clock $\phi_1$, $\phi_2$, $\phi_3$ and $\phi_4$ are derived from a basic serial clock SCK as shown in FIG. 2 so that the four interleaving clock $\phi_1$, $\phi_2$, $\phi_3$ and $\phi_4$ will alternatively and sequentially made active.

Assume that four digital data $D_1$, $D_2$, $D_3$ and $D_4$ appear on the signal lines 10, 12, 14 and 16, and these data should be serially outputted from only the terminal 20. This data transmission manner will be called "1-bit operation". In this operation, the input/output buffer 30 is maintained in an active condition and the other input/output buffers 32, 34 and 36 are put in an inactive condition so that the external terminals 22, 24 and 26 are maintained in a high impedance condition. In a first cycle of the serial clocks SCK, the interleaving clock $\phi_1$ is applied to the FET $Q_1$ to turn on the FET $Q_1$, and therefore, the data $D_1$ is inputted into the buffer 30 and then is outputted to the external terrminal 20. At this time, the FET $Q_2$, $Q_3$ and $Q_4$ are in an off condition, and the data $D_2$, $D_3$ and $D_4$ are supplied to the buffers 32, 34 and 36, respectively. However, since the buffers 32, 34 and 36 are inactive as mentioned above, the data $D_2$, $D_3$ and $D_4$ are not outputted to the terminals 22, 24 and 26.

In a second cycle of the serial clocks SCK, the interleaving clock $\phi_2$ is applied to the FET $Q_2$ to turn on the FET $Q_2$, and on the other hand, the FET $Q_1$, $Q_3$ and $Q_4$ are in an off condition. Therefore, the data $D_2$ is inputted into the buffer 30 and then is outputted to the external terminal 20.

In a third cycle, the interleaving clock $\phi_3$ is applied to the FET $Q_3$ to turn on the FET $Q_3$, so that the data $D_3$ is inputted into the buffer 30 and then is outputted to the external terminal 20, since the FET $Q_1$, $Q_2$ and $Q_4$ are in an off condition.

In a fourth cycle, the interleaving clock $\phi_4$ applied to the FET $Q_4$ to turn on the FET $Q_4$, so that the data $D_4$ is inputted into the buffer 30 and then is outputted to the external terminal 20.

Thus, the data $D_1$, $D_2$, $D_3$ and $D_4$ supplied to the signal lines 10, 12, 14 and 16 in parallel are serially outputted bit by bit from the terminal 20 in synchronism with the serial clock SCK.

In addition, in a serial data receiving case that a serial data is supplied through the terminal 20 to the input/output buffer 30, the data is distributed to the signal line 10, 12, 14 and 16 in accordance with the four interleaving clock $\phi_1$, $\phi_2$, $\phi_3$ and $\phi_4$, similarly to the above mentioned data sending case that the parallel data $D_1$, $D_2$, $D_3$ and $D_4$ are serially outputted to the terminal 20.

In a parallel data transmitting case, all the input/output buffers 30, 32, 34 and 36 are maintained in an active condition. At the same time, only the interleaving clock $\phi_1$ is ceaselessly maintained in an active condition, and on the other hand, the other interleaving clock $\phi_2$, $\phi_3$ and $\phi_4$ maintained in an inactive condition so that the signal lines 12, 14 and 16 are maintained in a condition isolated from the buffer 30. Therefore, the signal lines 10, 12, 14 and 16 are ceaselessly coupled to the buffers 30, 32, 34 and 36 in a one-to-one relation, respectively. Accordingly, respective bits of parallel data are transferred to one-to-one relation between the signal lines 10, 12, 14 and 16 and the external terminals 20, 22, 24 and 26 through the input/output buffers 30, 32, 34 and 36.

As seen from the above, the above mentioned input/output circuit can assume only two data input/output port arrangements or formats, one of which enables all the bits to use all the external terminals and the other of which enables only one bit to use only one external terminal. In other words, the conventional input/output circuit is low in feasibility of input/output port arrangement or format. In addition, it is necessary to interleave a control signal for an external serial clock, and therefore, a complicated signal system is required.

Figure 3:
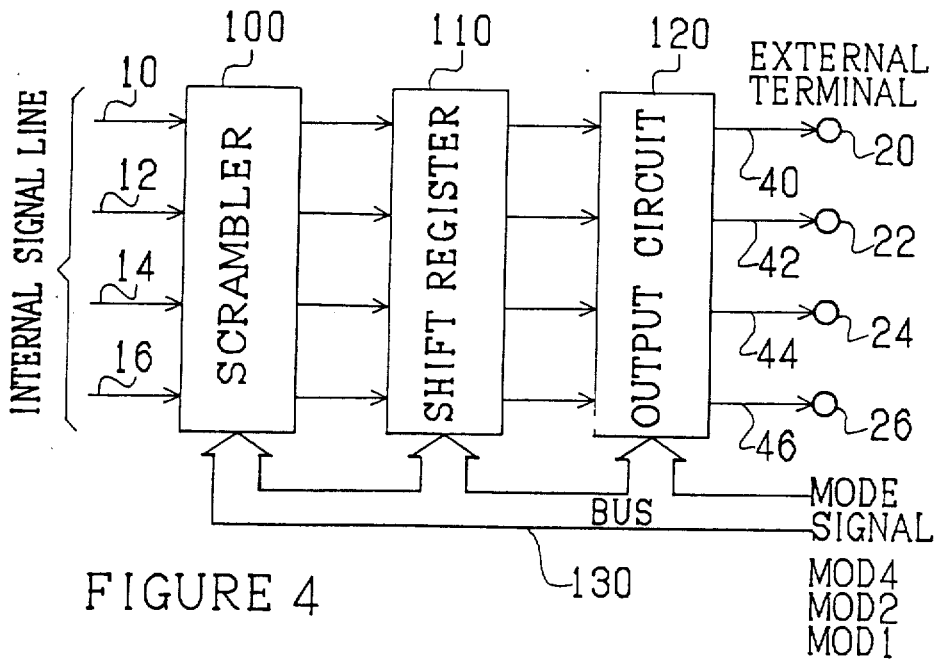
FIG. 3 is a block diagram illustrating an output port of a four-bit type digital input/output circuit embodying the present invention.
Figure 4:
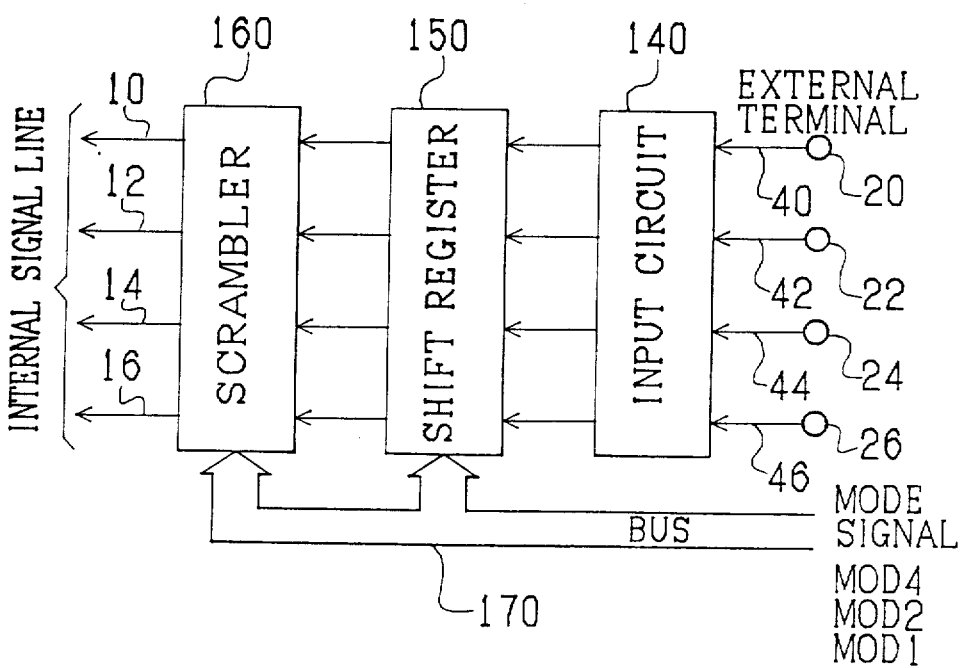
FIG. 4 is a block diagram illustrating an input port of a four-bit type digital input/output circuit embodying the present invention.

Turning to FIGS. 3 and 4, there are respectively shown block diagrams illustrating an output port and an input port of a four-bit type digital input/output circuit embodying the present invention.

The output port shown in FIG. 3 includes a scrambler 100 having four inputs connected to the internal signal lines 10, 12, 14 and 16 which form an internal data bus. The scrambler 100 has four outputs connected to four inputs of a shift register 110, which has four outputs connected to four outputs of an output circuit 120. This output circuit 120 has four outputs connected through the signal lines 40, 42, 44 and 46 to the external terminals 20, 22, 24 and 26, respectively. The scrambler 100, the shift register 110 and the output circuit 120 are respectively connected to receive mode signals MOD4, MOD2 and MOD1 through a mode signal bus 130. The mode signal MOD4 requires a four-bit parallel transmission, and the mode signal MOD2 requires a two-bit parallel transmission. The mode signal MOD1 requires a one-bit serial transmission.

With the above mentioned arrangement, the scrambler 100 responds to the mode signal so as to relocate the input bits into a positional arrangement of bits indicated by the mode signal. The shift register 110 latches the signals of four bits outputted from the scrambler 100 and shifts the latched bits by the amount indicated by the mode signal. For example, when the mode signal MOD4 is supplied, the shift register 110 outputs the received bits to the output circuit 120 without shift if the scrambler 100 does not change the position of the bits. If the scrambler 100 changes the position of the bits, the shift register 110 cyclicly shifts the received bits by a necessary amount for permitting the same position of bits as the positional arrangement of bits on the input signal lines 10 to 16 to be outputted to the output circuit 120. When the mode signal MOD2 or MOD1 is applied, the shift register 110 cyclicly shifts the received bits in accordance with a required amount determined by the mode signal.

The output circuit 120 outputs the bits received form the shift register 110 to all or selected one or ones of the external terminals 20 to 26 designated by the mode signal MOD4, MOD2 or MOD1.

The input port shown in FIG. 4 has an input circuit 140 having four inputs connected through the signal lines 40 to 46 to the external terminals 20 to 26. This input circuit 140 also has four outputs connected to a shift register 150, which in turn has four outputs connected to a scrambler 160. Four outputs of this scrambler 160 are connected to the internal signal lines 10 to 16, respectively. Further, the shift register 150 and the scrambler 160 are respectively connected to receive mode signals MOD4, MOD2 and MOD1 through a mode signal bus 170 so that these circuits are controlled as follows:

When the mode signal MOD4 is applied, the shift register 150 operates to simultaneously latch all the bits outputted form the input circuit 140. When the mode signal MOD2 is inputted, the shift register 150 latches only two bits of the four bits outputted from the input circuit 140, two times sequentially at different moments. Further, when the mode signal MOD1 is applied, the shift register 150 latches only one bit of the four bits outputted from the input circuit 140, four times sequentially at different moments. The scrambler 160 relocates the bits outputted from the shift register 150 into an arrangement of bits in accordance with the received mode signal MOD4, MOD2 or MOD1 and outputs the relocated bits to the internal signal lines 10 to 16 in parallel.

Figure 5:
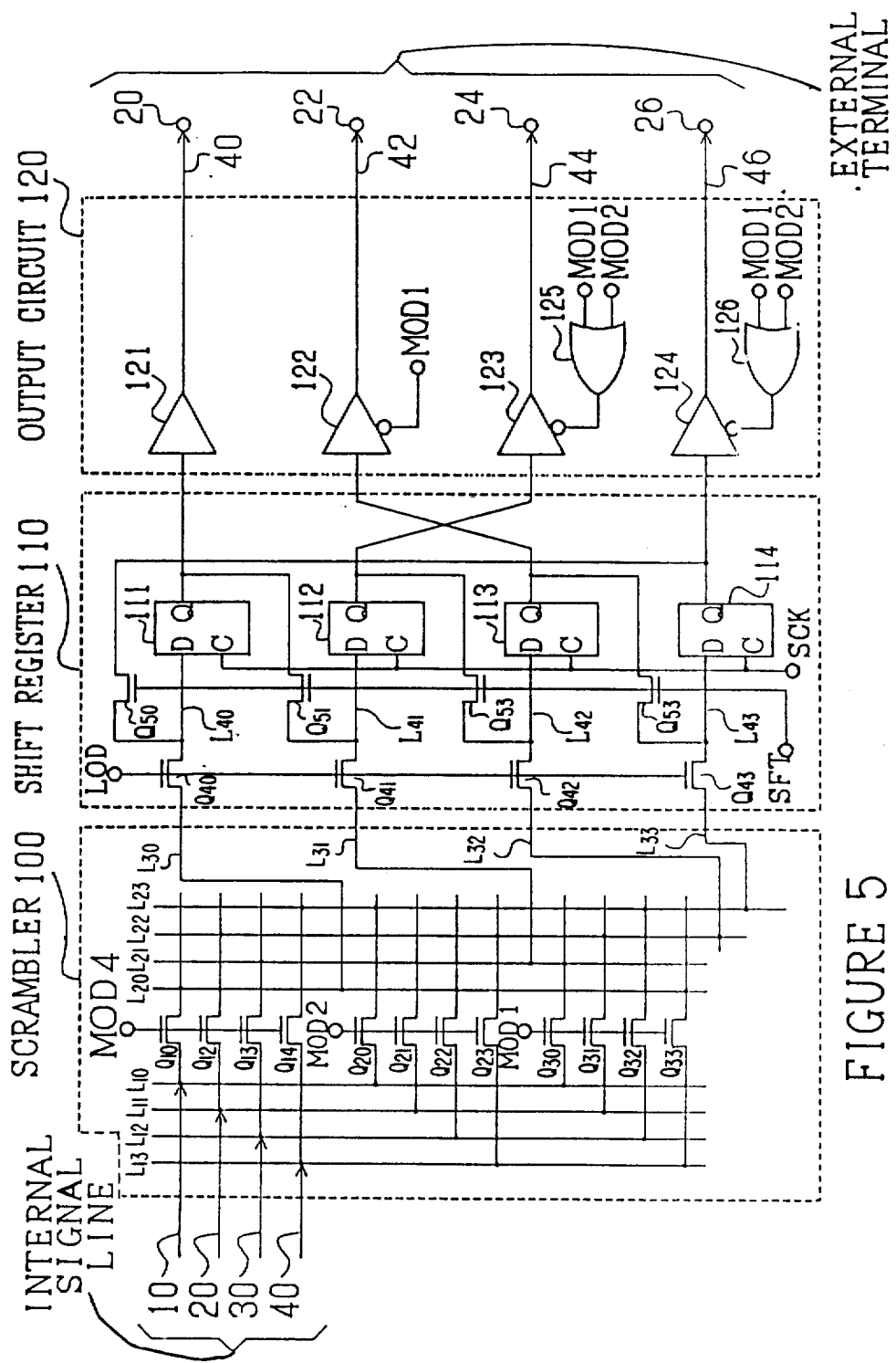
FIG. 5 is a circuit diagram of one embodiment of the output port in accordance with the present invention, which can be used as the output port shown in FIG. 3.

Referring to FIG. 5, there is shown a circuit diagram of one embodiment of the output port in accordance with the present invention, which can be used as the output port shown in FIG. 3.

The scrambler 100 comprises one set of four connection lines $L_{10}$, $L_{11}$, $L_{12}$ and $L_{13}$ which are connected to the internal signal lines 10, 12, 14 and 16, respectively, and which are respectively connected to one ends of four transfer gate FETs $Q_{10}$, $Q_{11}$, $Q_{12}$ and $Q_{13}$. These FETs have gates commonly connected to receive the mode signal MOD4 and coupled at their other ends to another set of four connection lines $L_{20}$, $L_{21}$, $L_{22}$ and $L_{23}$, as shown in the drawing. Namely, the other ends of the FETs $Q_{10}$, $Q_{11}$, $Q_{12}$ and $Q_{13}$ are connected to the connection lines $L_{20}$, $L_{22}$, $L_{21}$ and $L_{23}$, respectively.

The scrambler 100 includes another set of four transfer gate FETs $Q_{20}$, $Q_{21}$, $Q_{22}$ and $Q_{23}$ having their one ends connected to the connection lines $L_{10}$, $L_{11}$, $L_{12}$ and $L_{13}$, respectively and their other ends connected to the connection lines $L_{23}$, $L_{21}$, $L_{20}$ and $L_{22}$, respectively. Gates of these FETs $Q_{20}$, $Q_{21}$, $Q_{22}$ and $Q_{23}$ are commonly connected to receive the mode signal MOD2. Further, a third set of transfer gate FETs $Q_{30}$, $Q_{31}$, $Q_{32}$ and $Q_{33}$ are connected at their one ends to the connection lines $L_{10}$, $L_{11}$, $L_{12}$ and $L_{13}$, respectively and at their other ends connected to the connection lines $L_{21}$, $L_{22}$, $L_{23}$ and $L_{20}$, respectively. Gates of these FETs $Q_{30}$, $Q_{31}$, $Q_{32}$ and $Q_{33}$ are commonly connected to receive the mode signal MOD1.

The four connection lines $L_{20}$, $L_{21}$, $L_{22}$ and $L_{23}$ of the scrambler 100 are connected to four connection lines $L_{30}$, $L_{31}$, $L_{32}$ and $L_{33}$, which are respectively connected to one ends of four transfer gate FETs $Q_{40}$, $Q_{41}$, $Q_{42}$ and $Q_{43}$ of the shift register 110. These FETs have gates commonly connected to receive a gate control signal LOD and coupled at their other ends through four connection lines $L_{40}$, $L_{41}$, $L_{42}$ and $L_{43}$ to inputs D of four D-type flipflops 111, 112, 113 and 114. All the flipflops 111, 112, 113 and 114 are connected to receive the same basic clock SCK at their clock inputs, so that each time the clock SCK is inputted, the data on the lines $L_{40}$, $L_{41}$, $L_{42}$ and $L_{43}$ are latched in the D-type flipflops 111, 112, 113 and 114, respectively. In addition, the flipflops 111, 112, 113 and 114 have their outputs Q connected through four transfer gate FETs $Q_{51}$, $Q_{52}$, $Q_{53}$ and $Q_{50}$ to the four connection lines $L_{41}$, $L_{42}$, $L_{43}$ and $L_{40}$, respectively. These FETs $Q_{50}$, $Q_{51}$, $Q_{52}$ and $Q_{53}$ are connected to receive a shift signal SFT at their gates so that when the shift signal SFT is active, if the clock SCK is rendered active, the data on the outputs Q of the D-type flipflops 111, 112, 113 and 114 are shifted to the input of the D-type flipflops 112, 113, 114 and 111.

The output circuit 120 includes four output buffers 121, 122, 123 and 124. The output buffer 121 is connected at its input to the output Q of the flipflop 111 and at its output to the external terminal 20. The output buffer 122 is connected at its input to the output Q of the flipflop 113 and at its output to the external terminal 22 and has a control inverted input connected to receive the mode signal MOD1 so that when the mode signal MOD1 is active, the buffer 122 is put in an inactive condition. Further, the output buffer 123 is connected at its input to the output Q of the flipflop 112 and at its output to the external terminal 24 and has a control inverted input connected to an output of an OR gate 125 which receives the mode signal MOD1 and the mode signal MOD2. In addition, the output buffer 124 is connected at its input to the output Q of the flipflop 114 and at its output to the external terminal 26 and has a control inverted input connected to an output of an OR gate 126 which receives the mode signal MOD1 and the mode signal MOD2. Therefore, if either the mode signal MOD1 or the mode signal MOD2 is active, the buffers 123 and 124 are put in an inactive condition, respectively.

Now, operation of the output port shown in FIG. 5 will be explained with reference to FIGS. 6A to 6B and 7A and 7D which illustrate the relation between the data on the internal signal lines 10 to 16 and the data on the external terminals 20 to 26 of the output port shown in FIG. 5 in different operation modes.

(1) Active mode signal MOD4 (FIG. 6A)

When the mode signal MOD4 is made active, the other mode signals MOD2 and MOD1 are inactive. Accordingly, the FETs $Q_{10}$, $Q_{11}$, $Q_{12}$ and $Q_{13}$ are turned on so that the respective data $d_0$, $d_1$, $d_2$ and $d_3$ on the internal signal lines 10, 12, 14 and 16 are transferred through the connection lines $L_{20}$, $L_{22}$, $L_{21}$ and $L_{23}$ to the connection lines $L_{30}$, $L_{32}$, $L_{31}$ and $L_{33}$, as seen from FIG. 5. Namely, the data $d_1$ and $d_2$ are exchanged by the scrambler 100. Thus, the data $d_0$, $d_2$, $d_1$ and $d_3$ relocated in the named order are inputted form the connection lines $L_{30}$, $L_{31}$, $L_{32}$ and $L_{33}$ to the shift register 110, and then transferred to the lines $L_{40}$, $L_{41}$, $L_{42}$ and $L_{43}$ when the gate control signal LOD is made active. Thereafter, when the clock SCK is rendered active, the data $d_0$, $d_2$, $d_1$ and $d_3$ are latched to the flipflops 111, 112, 113 and 114, respectively, as shown in FIG. 6A. The data $d_0$, $d_2$, $d_1$ and $d_3$ thus latched in the flipflops 111, 112, 113 and 114 are outputted to the output buffers 121, 123, 122 and 124, respectively. Namely, the order of the data $d_2$ and $d_1$ is returned to the named order of $d_1$ and $d_2$. Accordingly, the dta $d_0 d_1$, $d_2$ and $d_3$ on the internal signal lines 10 to 16 are outputted to the output buffers 121, 122, 123 and 124, respectively. At this time, since the mode signal MOD4 is active and the other mode signals MOD2 and MOD1 are inactive, all the output buffers 121, 122, 123 and 124 are active or in an enable condition. Thus, the data $d_0$, $d_1$, $d_2$ and $d_3$ respectively inputted to the output buffers 121, 122, 123 and 124 are outputted to the external terminals 20 to 26, respectively.

(2) Active mode signal MOD2 (FIGS. 6B and 6C)

When the mode signal MOD2 is made active, the other mode signals MOD4 and MOD1 are inactive. Accordingly, the FETs $Q_{20}$, $Q_{21}$, $Q_{22}$ and $Q_{23}$ are turned on so that the respective data $d_0$, $d_1$, $d_2$ and $d_3$ on the internal signal lines 10, 12, 14 and 16 are relocated to the order of the respective data $d_2$, $d_1$, $d_3$ and $d_0$ and then transferred to the connection lines $L_{30}$, $L_{31}$, $L_{32}$ and $L_{33}$. The relocated data $d_2$, $d_1$, $d_3$ and $d_0$ are transferred to the lines $L_{40}$, $L_{41}$, $L_{42}$ and $L_{43}$ when the gate control signal LOD is made active. Thereafter, when the clock SCK is rendered active, the data $d_2$, $d_1$, $d_3$ and $d_0$ are latched to the flipflops 111, 112, 113 and 114, respectively, as shown in FIG. 6B. The data $d_2$, $d_1$, $d_3$ and $d_0$ thus latched in the flipflops 111, 112, 113 and 114 are outputted to the output buffers 121, 123, 122 and 124, respectively. At this time, since the mode signal MOD2 is active and the other mode signal MOD1 is inactive, the output buffers 121 and 122 are made active or in an enable condition and the output buffers 123 and 124 are made inactive or in an disable condition. Thus, only the data $d_2$ and $d_3$ respectively inputted to the output buffers 121 and 122 are outputted to the external terminals 20 and 22, respectively, as shown in FIG. 6B.

Thereafter, the gate control signal LOD is made inactive, so that the connection lines $L_{30}$, $L_{31}$, $L_{32}$ and $L_{33}$ are isolated form the lines $L_{40}$, $L_{41}$, $L_{42}$ and $L_{43}$. After this isolation, the active shift signal SFT is inputted to the gates of the FETs $Q_{50}$, $Q_{51}$, $Q_{52}$ and $Q_{53}$, so that the outputs Q of the flipflops 111, 112, 123 and 124 are connected to the inputs D of the flipflops 112, 123, 124 and 121, respectively. Therefore, after the shift signal SFT is made inactive and when the clock SCK is made active, the contents of the outputs Q of the flipflops 111, 112, 123 and 124 are latched in the flipflops 112, 123, 124 and 121, respectively. Namely, The data $d_0$, $d_2$, $d_1$ and $d_3$ are latched in the flipflops 111, 112, 113 and 114, respectively, as shown in FIG. 6C and are ouputted form the outputs Q of the flipflops 111, 112, 113 and 114 to the output buffers 121, 123, 122 and 124, respectively. Namely, the data $d_0$ and $d_1$ of the data $d_0$, $d_2$, $d_1$ and $d_3$ are outputted through the buffers 121 and 122 to the external terminals 20 and 22, respectively, as shown in FIG. 6C.

(3) Active mode signal MOD1 (FIGS. 7A, 7B, 7C and 6D)

Figure 7A:
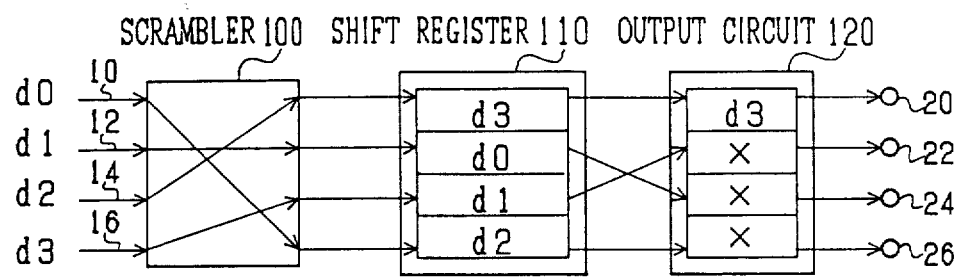

When the mode signal MOD1 is made active, the other mode signals MOD4 and MOD2 are inactive. Accordingly, the FETs $Q_{30}$, $Q_{31}$, $Q_{32}$ and $Q_{33}$ are turned on so that the respective data $d_0$, $d_1$, $d_2$ and $d_3$ on the internal signal lines 10, 12, 14 and 16 are relocated to the order of $d_3$, $d_0$, $d_1$ and $d_2$ and then transferred to the connection lines $L_{30}$, $L_{31}$, $L_{32}$ and $L_{33}$. The relocated data $d_3$, $d_0$, $d_1$ and $d_2$ are transferred to the lines $L_{40}$, $L_{41}$, $L_{42}$ and $L_{43}$ through the FETs $Q_{40}$, $Q_{41}$, $Q_{42}$ and $Q_{43}$ when the gate control signal LOD is made active. Thereafter, when the clock SCK is rendered active, the data $d_3$, $d_0$, $d_1$ and $d_2$ are latched to the flipflops 111, 112, 113 and 114, respectively, as shown in FIG. 7A. The data $d_3$, $d_0$, $d_1$ and $d_2$ thus latched in the flipflops 111, 112, 113 and 114 are outputted to the output buffers 121, 123, 122 and 124, respectively. At this time, since the mode signal MOD1 is active, only the output buffer 121 is in an enable condition and the output buffers 122, 123 and 124 are made inactive or in an disable condition. Thus, only the data $d_3$ inputted to the output buffer 121 is outputted to the external terminal 20 as shown in FIG. 7A.

Figure 7B:
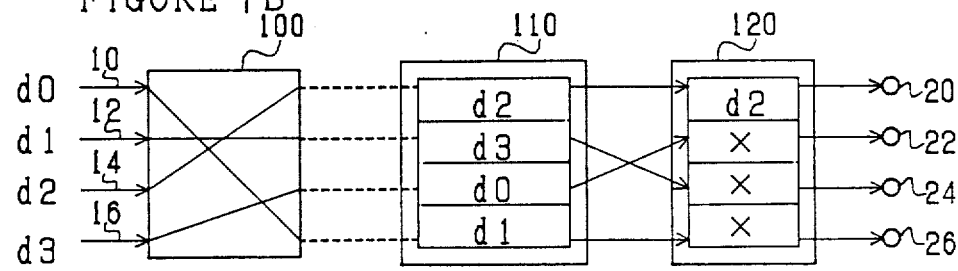
Figure 7C:
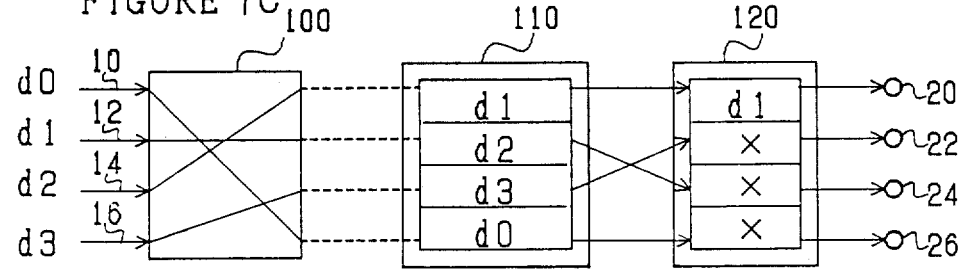
Figure 7D:
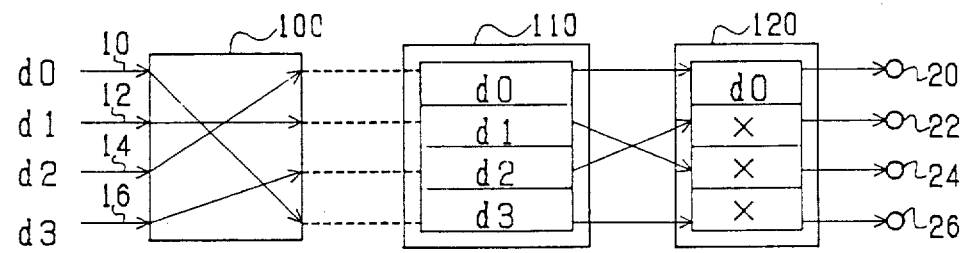

Thereafter, similarly to the case of the mode signal MOD4 being active, the gate control signal LOD is made inactive, so that the connection lines $L_{30}$, $L_{31}$, $L_{32}$ and $L_{33}$ are isolated from the lines $L_{40}$, $L_{41}$, $L_{42}$ and $L_{43}$. After this isolation, the active shift signal SFT is inputted to the gates of the FETs $Q_{50}$, $Q_{51}$, $Q_{52}$ and $Q_{53}$, so that the outputs Q of the flipflops 111, 112, 123 and 124 are connected to the inputs D of the flipflops 112, 123, 124 and 121, respectively. Therefore, after the shift signal SFT is made inactive and when the clock SCK is made active, the contents of the outputs Q of the flipflops 111, 112, 123 and 124 are latched in the flipflops 112, 123, 124 and 121, respectively. Namely, The data $d_2$, $d_3$, $d_0$ and $d_1$ are latched in the flipflops 111, 112, 113 and 114, respectively, as shown in FIG. 7B and are ouputted form the outputs Q of the flipflops 111, 112, 113 and 114 to the output buffers 121, 123, 122 and 124, respectively, so that the data $d_2$ is outputted through the buffer 121 to the external terminal 20, as shown in FIG. 7B. Thereafter, similarly, each time the shift control signal SFT and the clock SCK are applied, the data latched in the flipflops 111, 112, 113 and 114 are shifted by one bit so that the data $d_1$ and $d_0$ are sequentially outputted to the external terminal 20.

Thus, when the mode signal MOD1 is active, the data is sequentially outputted from the external terminal 20 in the order of $d_3$, $d_2$, $d_1$ and $d_0$.

Figure 8:
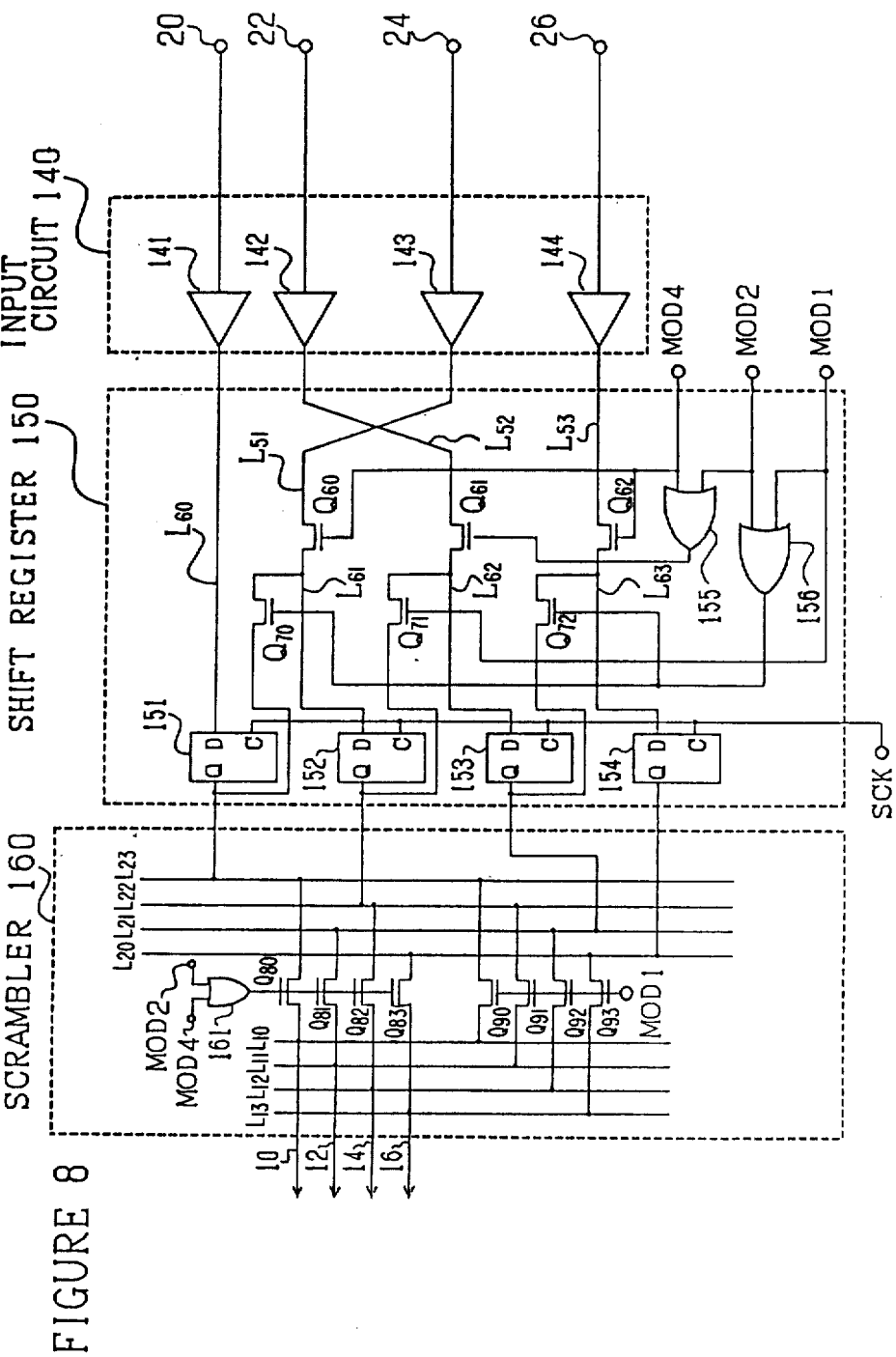
FIG. 8 is a circuit diagram of one embodiment of the input port in accordance with the present invention, which can be used as the input port shown in FIG. 3.

Turning to FIG. 8, there is shown a circuit diagram of one embodiment of the input port in accordance with the present invention, which can be used as the input port shown in FIG. 3.

The input circuit 140 includes four input buffers 141, 142, 143 and 144 located in parallel and having their inputs connected to the external terminals 20 to 26, respectively.

An output of the input buffer 141 is connected through a connection line $L_{60}$ to an input D of a D-type flipflop 151 included in the shift register 150. An output of the input buffer 143 in coupled to an input D of a D-type flipflop 152 through a connection line $L_{51}$, a transfer gate FET $Q_{60}$ and a connection line $L_{61}$. The FET $Q_{60}$ has a gate connected to receive the mode signal MOD4 so that the signal MOD4 is active, the line $L_{51}$ is connected to the line $L_{61}$. An output of the input buffer 142 is coupled through a connection line $L_{52}$, a transfer gate FET $Q_{61}$ and a connection line $L_{62}$ to an input D of a D-type flipflop 153. The FET $Q_{61}$ has a gate connected to receive through an OR gate 155 the mode signal MOD4 and the mode signal MOD2 so that the signal MOD4 or MOD2 is active, the line $L_{52}$ is connected to the line $L_{62}$. An output of the input buffer 144 is coupled to an input D of a D-type flipflop 154 through a connection line $L_{53}$, a transfer gate FET $Q_{62}$ and a connection line $L_{63}$. The FET $Q_{62}$ has a gate connected to receive the mode signal MOD4 so that the signal MOD4 is active, the line $L_{53}$ is connected to the line $L_{63}$.

All the flipflops 151 to 154 are connected to receive the same clock SCK at their clock inputs. Further, a Q output of the flipflop 151 is connected to the line $L_{61}$ through a transfer gate FET $Q_{70}$ whose gate is connected to receive the mode signals MOD2 and MOD1 through an OR gate 156, so that when either the mode signal MOD2 or MOD1 is made active, the output of the flipflop 151 is coupled to the input D of the flipflop 152. Similarly, a Q output of the flipflop 152 is connected to the line $L_{62}$ through a transfer gate FET $Q_{71}$ whose gate is connected to receive the mode signal MOD1. In addition, a Q output of the flipflop 153 is connected to the line $L_{63}$ through a transfer gate FET $Q_{72}$ whose gate is connected to receive the mode signals MOD2 and MOD1 through the OR gate 156.

The respective outputs Q of the flipflops 151 to 154 are connected to four connection lines $L_{23}$, $L_{22}$, $L_{21}$ and $L_{20}$, respectively. These connection lines $L_{23}$, $L_{22}$, $L_{21}$ and $L_{20}$ are connected through transfer gate FETs $Q_{80}$, $Q_{82}$, $Q_{81}$ and $Q_{83}$ to four connectioon lines $L_{10}$, $L_{12}$, $L_{11}$ and $L_{13}$, respectively. The FETs $Q_{80}$, $Q_{82}$, $Q_{81}$ and $Q_{83}$ have their gates commonly connected to receive through an OR gate 161 the mode signals MOD4 and MOD2 so that either the mode signal MOD4 or MOD2 is active, the lines $L_{23}$, $L_{22}$, $L_{21}$ and $L_{20}$ are connected to the lines $L_{10}$, $L_{12}$, $L_{11}$ and $L_{13}$, respectively. Further, the lines $L_{23}$, $L_{22}$, $L_{21}$ and $L_{20}$ are respectively connected to four connection lines $L_{10}$, $L_{11}$, $L_{12}$ and $L_{13}$ through transfer gate FETs $Q_{90}$, $Q_{91}$, $Q_{92}$ and $Q_{93}$ whose gates are commonly connected to receive the mode signal MODE1. The four connection lines $L_{10}$, $L_{11}$, $L_{12}$ and $L_{13}$ are connected to the internal signal lines 10, 12, 14 and 16, respectively.

Now, operation of the input port shown in FIG. 8 will be explained with reference to FIGS. 9A to 9C and 10A and 10D which illustrate the relation between the data on the internal signal lines 10 to 16 and the data on the external terminals 20 to 26 of the input port shown in FIG. 8 in different operation modes.

Figure 9A:
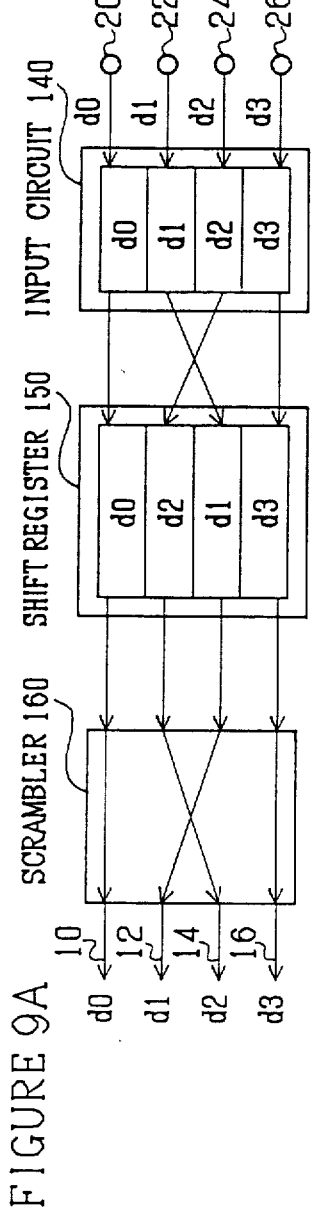
FIGS. 9A to 9C and 10A and 10D illustrate the relation between the data on the internal signal lines and the data on the external terminals of the input port shown in FIG. 8 in different operation modes.

(1) Active mode signal MOD4 (FIG. 9A)

When the mode signal MOD4 is made active, the other mode signals MOD2 and MOD1 are inactive. Accordingly, the FETs $Q_{70}$, $Q_{71}$, $Q_{72}$ and $Q_{73}$ are maintained off and the FETs $Q_{60}$, $Q_{61}$ and $Q_{12}$ are turned on. Therefore, the data $d_0$, $d_1$, $d_2$ and $d_3$ inputted form the external terminals 20, 22, 24 and 26 are inputted through the input buffers 141 to 144 to the connection lines $L_{60}$, $L_{62}$, $L_{61}$ and $L_{63}$. When the clock SCK is rendered active, the flipflops 151, 153, 152 and 154 respectively latch the data $d_0$, $d_2$, $d_1$ and $d_3$ on the lines 60, 61, 62 and 63, as shown in FIG. 9A. The data $d_0$, $d_2$, $d_1$ and $d_3$ thus latched are outputted from the Q outputs of the the flipflops 151, 153, 152 and 154 to the connection lines $L_{23}$, $L_{22}$, $L_{21}$ and $L_{20}$ of the scrambler 160, respectively. The data $d_0$, $d_2$, $d_1$ and $d_3$ on the lines $L_{23}$, $L_{2i}$, $L_{21}$ and $L_{20}$ are supplied through the FETs $Q_{80}$, $Q_{82}$, $Q_{81}$ and $Q_{83}$ to the connection lines $L_{10}$, $L_{11}$, $L_{12}$ and $L_{13}$, as seen from FIG. 8. Namely, the positions of data $d_2$ and $d_1$ are exchanged by the scrambler 160. Thus, the data $d_0$, $d_1$, $d_2$ and $d_3$ relocated in the named order are inputted form the connection lines $L_{10}$, $L_{11}$, $L_{12}$ and $L_{13}$ to the internal signal lines 10, 12, 14 and 16, respectively. Accordingly, the data $d_0$, $d_1$, $d_2$ and $d_3$ on the external terminals 20 to 26 are inputted to the internal signal lines 10 to 16, respectively.

Figure 9B:
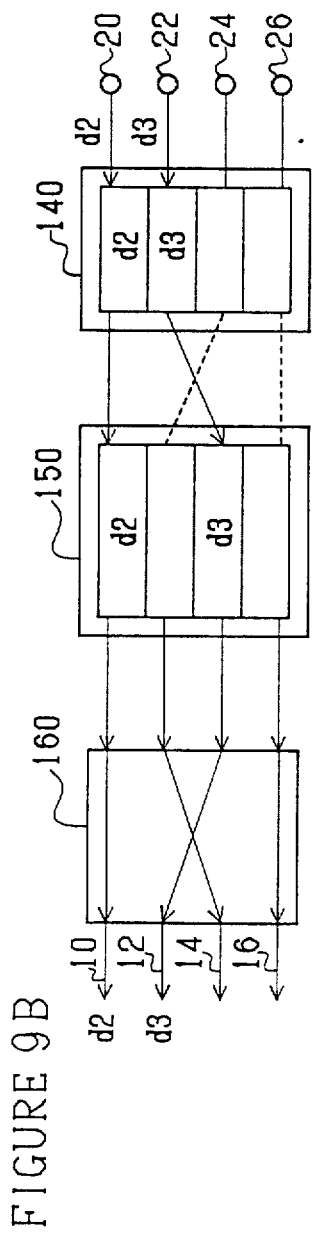
Figure 9C:
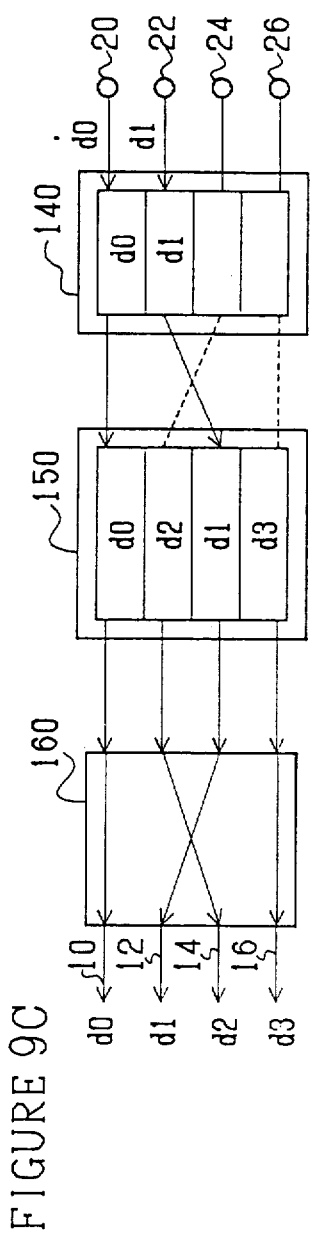

(2) Active mode signal MOD2 (FIGS. 9B and 9C)

When the mode signal MOD2 is made active, the other mode signals MOD4 and MOD1 are inactive. Accordingly, the FETs $Q_{60}$, $Q_{62}$ and $Q_{71}$ are maintained off and the FETs $Q_{61}$, $Q_{70}$ and $Q_{72}$ are turned on. Therefore, the data $d_2$ and $d_3$ inputted to the external terminals 20 and 22 are supplied through the input buffers 141 and 142 to the connection lines $L_{60}$ and $L_{62}$. When the clock SCK is rendered active, the flipflops 151 and 153 respectively latch the data $d_2$ and $d_3$, as shown in FIG. 9B. The data $d_2$ and $d_3$ thus latched are outputted from the Q outputs of the the flipflops 151 and 153 to the internal signal lines 10 and 12, respectively.

After the data $d_2$ and $d_3$ are latched in the flipflops 151 and 153, the data $d_0$ and $d_1$ are inputted to the external terminals 20 and 22. The data $d_0$ and $d_1$ inputted to the external terminals 20 and 22 are supplied through the input buffers 141 and 142 to the connection lines $L_{60}$ and $L_{62}$. When the clock SCK is rendered active, the flipflops 151 and 153 respectively latch the data $d_0$ and $d_1$, and the flipflops 152 and 154 respectively latch the data $d_2$ and $d_3$ outputted from the Q outputs of the flipflops 151 and 153 through the FETs $Q_{70}$ and $Q_{72}$ in the conductive condition, as shown in FIG. 9C. The data $d_0$, $d_2$, $d_1$ and $d_3$ thus latched are outputted from the Q outputs of the the flipflops 151 to 154 through the scrambler 160 to the internal signal lines 10 to 16 in the order of data $d_0$, $d_1$, $d_2$ and $d_3$, as shown in FIG. 9C.

Accordingly, the data $d_2$ and $d_3$ and the data $d_0$ and $d_1$ which are sequentially supplied in a two-bits-by-two-bits manner to the external terminals 20 and 22 are inputted to the internal signal lines 10 to 16 in the order of data $d_0$, $d_1$, $d_2$ and $d_3$ in a parallel arrangement.

(3) Active mode signal MOD1 (FIGS. 10A, 10B, 10C and 10 D)

When the mode signal MOD1 is made active, the other mode signals MOD4 and MOD2 are inactive. Accordingly, the FETs $Q_{60}$, $Q_{61}$ and $Q_{62}$ are maintained off and the FETs $Q_{70}$, $Q_{71}$ and $Q_{72}$ are turned on. Therefore, only the output of the input buffer 141 of the four buffers 141 to 144 is inputted to the input D of the flipflop 151.

Figure 10A:
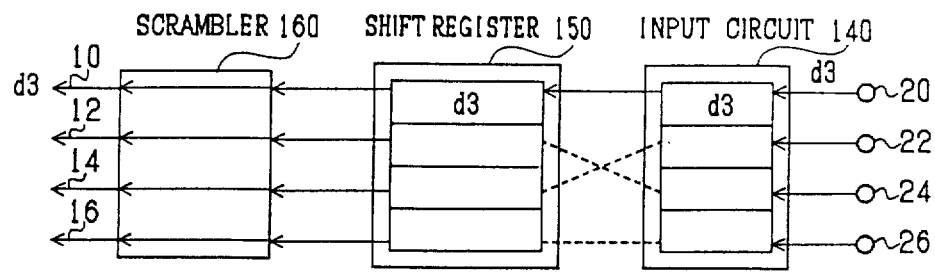
Figure 10B:
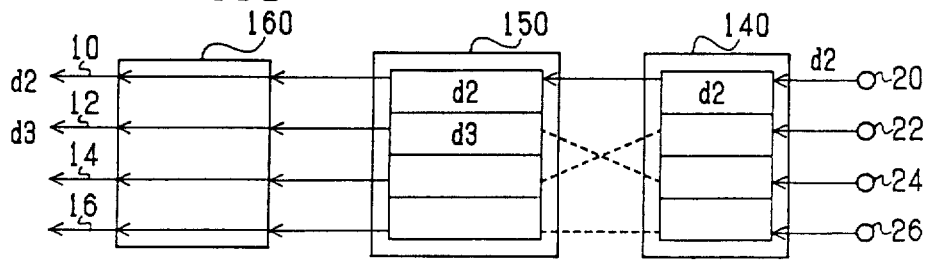
Figure 10C:
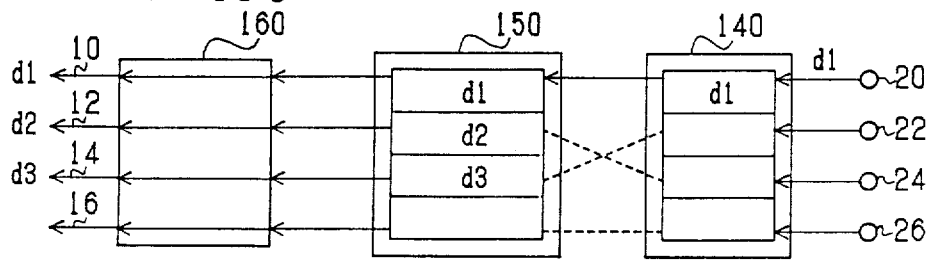
Figure 10D:
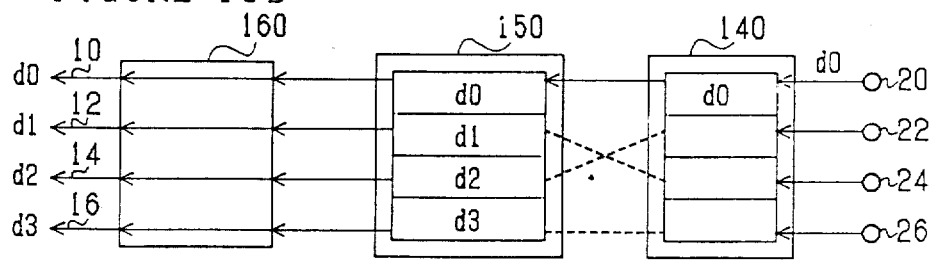

When the data $d_3$ is inputted to the external terminal 20 and the active clock SCK is applied to the four flipflops 151 to 154, the flipflop 151 latches the data $d_3$, as shown in FIG. 10A. At the next clock SCK, the data $d_2$ is inputted to the external terminal 20 so that the flipflop 151 latches the data $d_2$, and the flipflop 152 latches the data $d_3$ outputted from the Q output of the flipflop 151 through the conducting FET $Q_{70}$, as shown in FIG. 10B. Similarly, at third and fourth clocks SCK, the data $d_1$ and $d_0$ are sequentially inputted to the external terminal 20 so that the flipflop 151 sequentially latches the data $d_1$ and $d_0$. On the other hand, the data latched in the respective flipflops are sequentially shifted. As result, after the fourth clock SCK, the data $d_0$, $d_1$, $d_2$ and $d_3$ are latched in the the flipflops 151 to 154 and are outputted from the Q outputs of the flipflops 151 to 154 through the FETs $Q_{90}$, $Q_{91}$, $Q_{93}$ and $Q_{94}$ of the scrambler 160 to the internal signal lines 10 to 16 in the order of data $d_0$, $d_1$, $d_2$ and $d_3$, as shown in FIG. 10D.

Accordingly, the data $d_3$, $d_2$, $d_1$ and $d_1$ which are sequentially supplied byit by bit to the external terminal 20 are inputted to the internal signal lines 10 to 16 in the order of data $d_0$, $d_1$, $d_2$ and $d_3$ in a parallel arrangement.

Figure 11:
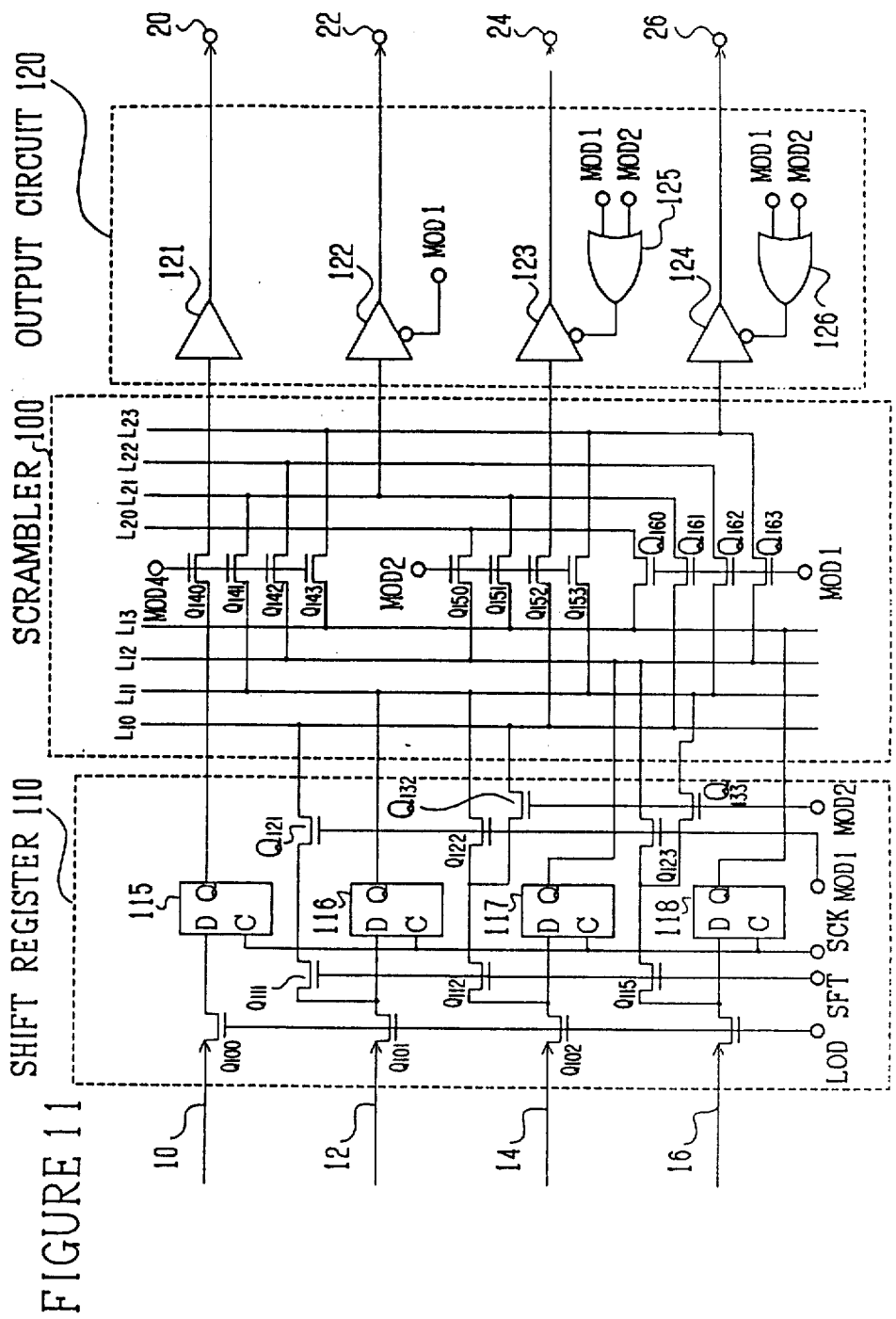
FIG. 11 is a circuit diagram of another embodiment of the output port in accordance with the present invention, which can be used as the output port shown in FIG. 3.

Referring to FIG. 11, there is shown a circuit diagram of another embodiment of the output port in accordance with the present invention, which can be used as the output port shown in FIG. 3. But, as seen form comparison between FIGS. 3 and 11, the scrambler 100 and the shift register 110 are exchanged in positional sequence.

The shift register 110 includes four FETs $Q_{100}$, $Q_{101}$, $Q_{102}$ and $Q_{103}$ connected at their one ends to the internal signal lines 10, 12, 14 and 16, respectively. The FETs $Q_{100}$, $Q_{101}$, $Q_{102}$ and $Q_{103}$ have their gates commonly connected to receive a gate control signal LOD, and the other ends of the FETs $Q_{100}$, $Q_{101}$, $Q_{102}$ and $Q_{103}$ are connected to inputs D of four D-type flipflops 115, 116, 117 and 118, respectively, so that when the gate control signal LOD is made active, the signal on the internal signal lines 10 to 16 are inputted to the inputs D of four D-type flipflops 115, 116, 117 and 118. These flipflops are connected to receive the clock signal SCK at their clock input C, and D outputs of the flipflops 115, 116, 117 and 118 are connected to the four connection lines $L_{10}$, $L_{11}$, $L_{12}$ and $L_{13}$ of the scrambler 100.

Further, the D input of the flipflop 116 is connected to the connection line $L_{10}$ through FETs $Q_{111}$ and $Q_{121}$, and the D input of the flipflop 117 is connected to the connection line $L_{11}$ through FETs $Q_{112}$ and $Q_{122}$ and to the connection line $L_{10}$ through FETs $Q_{112}$ and $Q_{132}$. In addition, the D input of the flipflop 118 is connected to the connection line $L_{12}$ through FETs $Q_{113}$ and $Q_{123}$ and to the connection line $L_{11}$ through FETs $Q_{113}$ and $Q_{133}$. FETs $Q_{111}$, $Q_{112}$ and $Q_{113}$ have their gates commonly connected to receive the shift control signal SFT. FETs $Q_{121}$, $Q_{122}$ and $Q_{123}$ have their gates commonly connected to receive the mode signal MOD1. FETs $Q_{132}$ and $Q_{133}$ have their gates commonly connected to receive the mode signal MOD2.

In the scrambler 100, the four connection lines $L_{10}$, $L_{11}$, $L_{12}$ and $L_{13}$ are connected to four connection lines $L_{20}$, $L_{21}$, $L_{22}$ and $L_{23}$, respectively, through FETs $Q_{140}$, $Q_{141}$, $Q_{142}$ and $Q_{143}$ whose gates are connected to receive the mode signal MOD4. Further, the connection lines $L_{12}$, $L_{13}$, $L_{10}$ and $L_{11}$ are connected to the connection lines $L_{20}$, $L_{21}$, $L_{22}$ and $L_{23}$, respectively, through FETs $Q_{150}$, $Q_{151}$, $Q_{152}$ and $Q_{153}$ whose gates are connected to receive the mode signal MOD2. The connection lines $L_{13}$, $L_{10}$, $L_{11}$ and $L_{12}$ are also connected to the connection lines $L_{20}$, $L_{21}$, $L_{22}$ and $L_{23}$, respectively, through FETs $Q_{160}$, $Q_{161}$, $Q_{162}$ and $Q_{163}$ whose gates are connected to receive the mode signal MOD1.

The output circuit 120 shown in FIG. 11 are constructed similar to that shown in FIG. 5. But the connection lines $L_{20}$, $L_{21}$, $L_{22}$ and $L_{23}$ are connected to the inputs of the output buffers 121 to 124, respectively.

Now, the operation of the output port shown in FIG. 11 will be explained with reference to FIGS. 12A to 12C and 13A and 13D which illustrate the relation between the data on the internal signal lines 10 to 16 and the data on the external terminals 20 to 26 of the output port shown in FIG. 11 in different operation modes.

(1) Active mode signal MOD4 (FIG. 12A)

When the mode signal MOD4 is made active, the other mode signals MOD2 and MOD1 are inactive. Accordingly, FETs $Q_{121}$, $Q_{122}$ and $Q_{123}$, FETs $Q_{132}$ and $Q_{133}$ FETs $Q_{150}$, $Q_{151}$, $Q_{152}$ and $Q_{153}$ and FETs $Q_{160}$, $Q_{161}$, $Q_{162}$ and $Q_{163}$ are maintained off, and the FETs $Q_{140}$, $Q_{141}$, $Q_{142}$ and $Q_{143}$ are turned on. In addition, all the output buffers 121 to 124 are maintained in the enable condition. Therefore, the respective data $d_0$, $d_1$, $d_2$ and $d_3$ on the internal signal lines 10, 12, 14 and 16 are transferred to the flipflops 115 to 118 when the gate control signal LOD is made active and latched to these flipflops when the clock SCK is made active. As a result, the respective data $d_0$, $d_1$, $d_2$ and $d_3$ latched in the flipflops 115 to 118 to the external terminals 20 to 26, respectively, without relocation of parallel data bits, as shown in FIG. 12A.

(2) Active mode signal MOD2 (FIGS. 6B and 6C)

When the mode signal MOD2 is made active, the other mode signals MOD4 and MOD1 are inactive. Accordingly, FETs $Q_{121}$, $Q_{122}$ and $Q_{123}$, FETs $Q_{140}$, $Q_{141}$, $Q_{142}$ and $Q_{143}$ and FETs $Q_{140}$, $Q_{161}$, $Q_{162}$ and $Q_{163}$ are maintained off and the FETs $Q_{132}$ and $Q_{133}$, and FETs $Q_{150}$, $Q_{151}$, $Q_{152}$ and $Q_{153}$ are turned on. In addition, the output buffers 121 and 122 are maintained in the enable condition but the output buffers 123 and 124 are maintained in the disable condition.

Thus, when the gate control signal LOD is made active, the respective data $d_0$, $d_1$, $d_2$ and $d_3$ on the internal signal lines 10, 12, 14 and 16 are inputted to the flipflops 115 to 118, and then latched to these flipflops when the clock SCK is made active. As a result, the respective data $d_0$, $d_1$, $d_2$ and $d_3$ latched in the flipflops 115 to 118. Therefore, the respective data $d_2$ and $d_3$ latched in the flipflops 117 and 118 to the external terminals 20 and 22, respectively, through the FETs $Q_{150}$ and $Q_{151}$, as shown in FIG. 12A.

Thereafter, the gate control signal LOD is made inactive, so that the signal lines 10 to 16 are isolated form the flipflops 115 to 118. After this isolation, the active shift signal SFT is inputted to the gates of the FETs $Q_{111}$ to $Q_{113}$, so that the outputs Q of the flipflops 115 and 116 are connected to the inputs D of the flipflops 117 and 118, respectively. Therefore, after the shift signal SFT made inactive and when the clock SCK is made active, the outputs Q of the flipflops 115 and 116 are latched in the flipflops 117 and 118, respectively. Namely, the data $d_0$ and $d_2$, are latched in the flipflops 117 and 118, respectively, as shown in FIG. 12C and are outputted to the output buffers 121 and 122, respectively. On the other hand, the content of the flipflops 115 and 116 are not constant. Thus, the data $d_0$ and $d_1$ of the data $d_0$, $d_2$, $d_1$ and $d_3$ are outputted through the buffers 121 and 122 to the external terminals 20 and 22, respectively, as shown in FIG. 12C.

(3) Active mode signal MOD1 (FIGS. 13A, 13B, 13C and 13D)

When the mode signal MOD1 is made active, the other mode signals MOD4 and MOD2 are inactive. Accordingly, FETs $Q_{132}$ and $Q_{133}$, FETs $Q_{140}$, $Q_{141}$, $Q_{142}$ and $Q_{143}$ and FETs $Q_{132}$ and $Q_{133}$, FETs $Q_{140}$, $Q_{141}$, $Q_{142}$ and $Q_{143}$ and FETs $Q_{150}$ and $Q_{151}$, $Q_{152}$ and $Q_{153}$ are maintained off, and the FETs $Q_{121}$, $Q_{122}$ and $Q_{123}$, and FETs $Q_{160}$, $Q_{161}$, $Q_{162}$ and $Q_{163}$ are turned on. In addition, only the output buffer 121 is maintained in the enable condition but the output buffers 122, 123 and 124 are maintained in the disable condition.

Figure 13A:
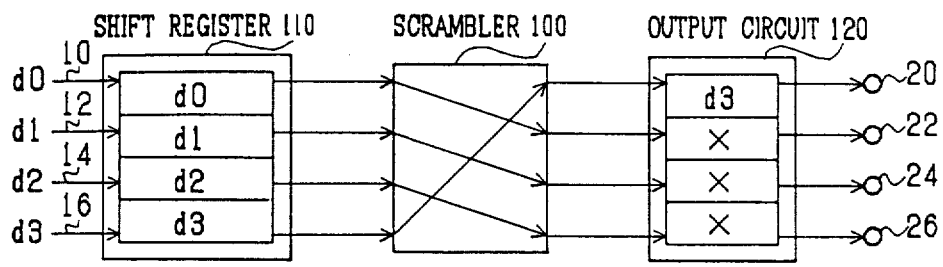

Thus, when the gate control signal LOD is made active, the respective data $d_0$, $d_1$, $d_2$ and $d_3$ on the internal signal lines 10, 12, 14 and 16 are inputted to the flipflops 115 to 118, and the latched to these flipflops when the clock SCK is made active. As a result, the respective data $d_0$, $d_1$, $d_2$ and $d_3$ latched in the flipflops 115 to 118. Therefore, the respective data $d_3$ latched in the flipflop 118 is outputted to the external terminal 20 through the FET $Q_{160}$, as shown in FIG. 13A.

Figure 13B:
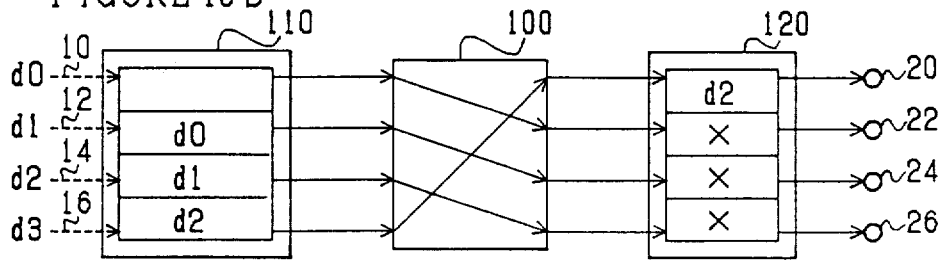
Figure 13C:
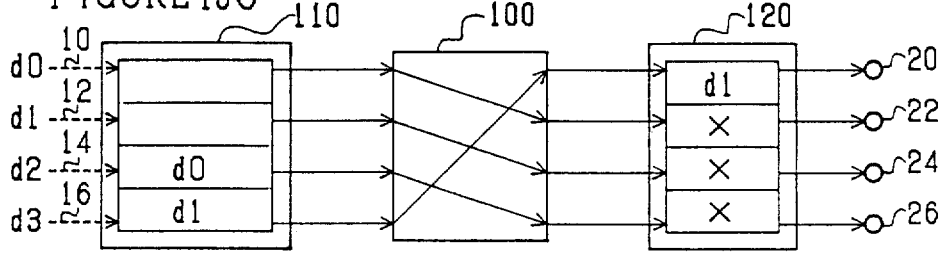
Figure 13D:
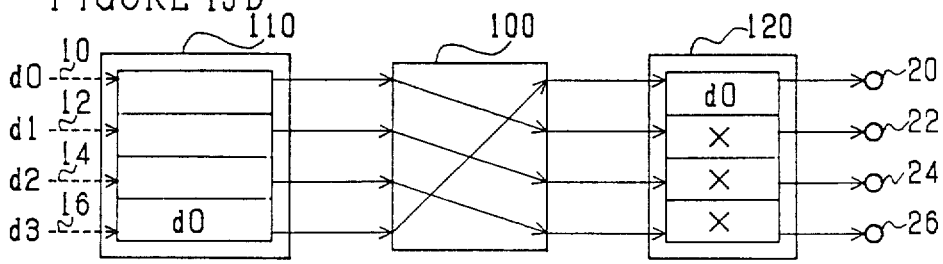

Thereafter, the gate control signal LOD is made inactive, so that the signal lines 10 to 16 are isolated form the flipflops 115 to 118. After this isolation, the active signal SFT is inputted to the gates of the FETs $Q_{111}$ to $Q_{113}$, so that the inputs Q of the flipflops 115, 116 and 117 are connected to the inputs D of the flipflops 116, 117 and 118, respectively. Therefore, after the shift signal SFT made inactive and when the clock SCK is made active, the outputs Q of the flipflops 115, 116 and 117 are latched in the flipflops 116, 117 and 118, respectively. Namely, the data $d_0$, $d_1$ and $d_2$, are latched in the flipflops 116, 117 and 118, respectively, as shown in FIG. 13B and the data $d_2$ is outputted to the output buffer 121.

Thereafter, similarly, each time the shift control signal SFT and the clock SCK are applied, the data latched in the flipflops 115, 116, 117 and 118 are shifted by one bit so that the data $d_1$ and $d_0$ are sequentially outputted to the external terminal 20.

Thus, when the mode signal MOD1 is active, the data is sequentially outputted from the external terminal 20 in the order of $d_3$, $d_2$, $d_1$ and $d_0$.

Figure 14:
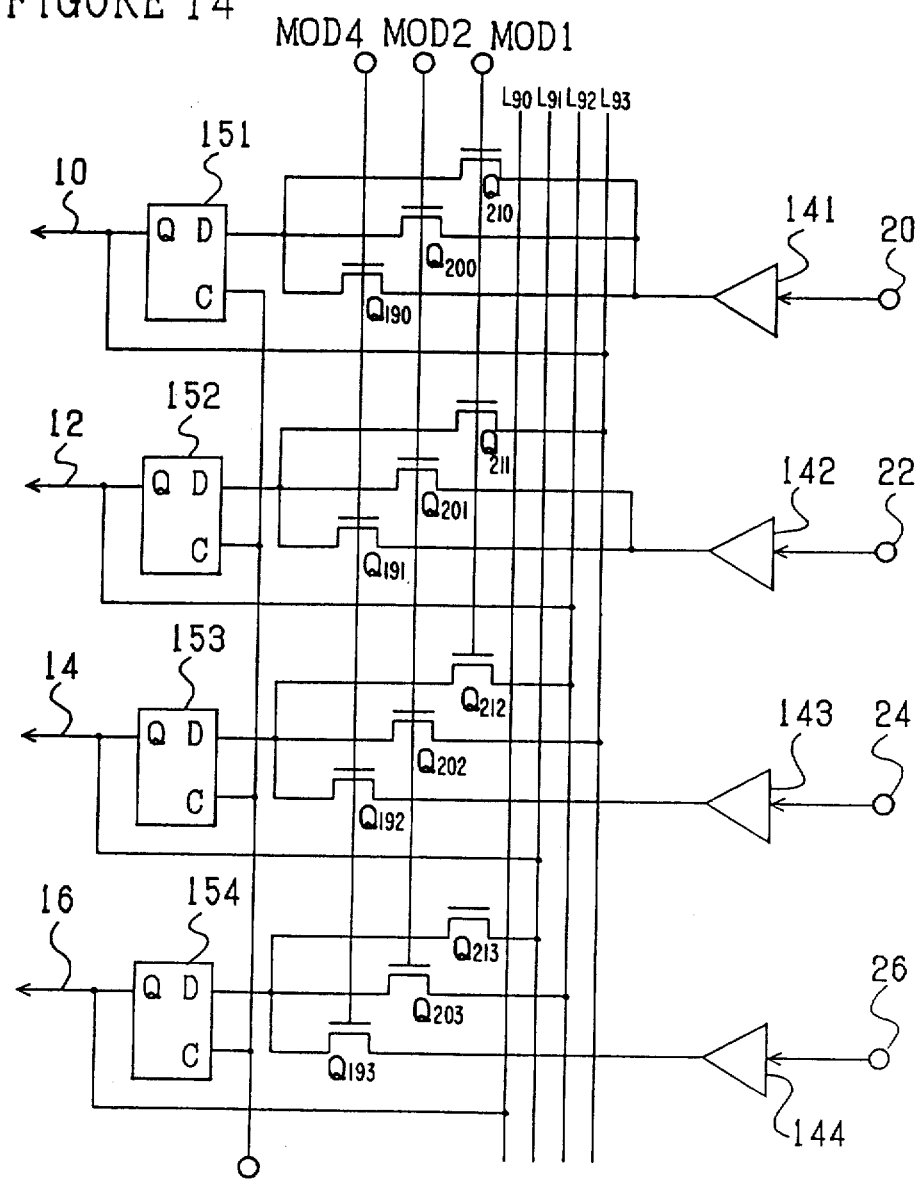
FIG. 14 is a circuit diagram of another embodiment of the input port in accordance with the present invention, which can be used as the input port shown in FIG. 3.

Turning to FIG. 14, there is shown a circuit diagram of another embodiment of the input port in accordance with the present invention, which can be used as the input port shown in FIG. 3.

The input circuit 140 includes four input buffers 141, 142, 143 and 144 located in parallel and having their inputs connected to the external terminals 20 to 26, respectively.

An output of the input buffer 141 is connected through three parallel-connected FET $Q_{190}$, $Q_{200}$ and $Q_{210}$ to an input D of the D-type flipflop 151, which has a Q output connected to the internal signal line 10 and a connection line $L_{93}$. An output of the input buffer 142 is connected through two parallel-connected FET $Q_{191}$ and $Q_{201}$ to an input D of the D-type flipflop 152, which has a Q output connected to the internal signal line 12 and a connection line $L_{92}$. An output of the input buffer 143 is connected through a FET $Q_{192}$ to an input D of the D-type flipflop 153, which has a Q output connected to the internal signal line 14 and a connection line $L_{91}$. Further, an output of the input buffer 144 is connected through a FET $Q_{193}$ to an input D of the D-type flipflop 154, which has a Q output connected to the internal signal line 116 and a connection line $L_{90}$. In addition, the D input of the flipflop 152 is connected to the connection line $L_{93}$ through a FET $Q_{211}$. The D input of the flipflop 153 is connected to the connection line $L_{93}$ through a FET $Q_{202}$ and to the connection line $L_{92}$ through a FET $Q_{212}$. Further, the D input of the flipflop 154 is connected to the connection line $L_{92}$ through a FET $Q_{203}$ and to the connection line $L_{91}$ through a FET $Q_{213}$.

The FET $Q_{190}$, $Q_{191}$, $Q_{192}$ and $Q_{193}$ have their gates commonly connected to receive the mode signal MOD4. The FET $Q_{200}$, $Q_{201}$, $Q_{202}$ and $Q_{203}$ have their gates commonly connected to receive the mode signal MOD2. The FET $Q_{210}$, $Q_{211}$, $Q_{212}$ and $Q_{213}$ have their gates commonly connected to receive the mode signal MOD1.

Now, operation of the output port shown in FIG. 14 will be explained with reference to FIGS. 15A to 15C and 16A and 16D which illustrate the relation between the data on the terminal signal lines 10 to 16 and the data on the external terminals 20 to 26 of the input port shown in FIG. 14 in different operation modes.

Figure 15A:
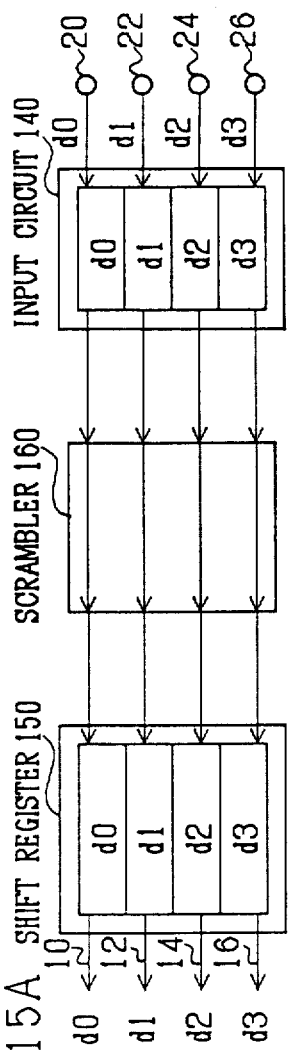
FIGS. 15A to 15C and 16A and 16D illustrate the relation between the data on the internal signal lines and the data on the external terminals of the input port shown in FIG. 14 in different operation modes.

(1) Active mode signal MOD4 (FIG. 15A)

When the mode signal MOD4 is made active, the other mode signals MOD2 and MOD1 are inactive. Accordingly, the FET $Q_{200}$, $Q_{201}$, $Q_{202}$ and $Q_{203}$ and the FET $Q_{210}$, $Q_{211}$, $Q_{212}$ and $Q_{213}$ are maintained off and the FET $Q_{190}$, $Q_{191}$, $Q_{192}$ and $Q_{193}$ are turned on. Therefore, the data $d_0$, $d_1$, $d_2$ and $d_3$ inputted on the external terminals 20, 22, 24 and 26 are applied through the input buffers 141 to 144 and to the FET $Q_{190}$, $Q_{191}$, $Q_{192}$ and $Q_{193}$ to the flipflops 151, 153, 152 and 154, respectively. These flipflops latch the data $d_0$, $d_2$, $d_1$ and $d_3$, as shown in FIG. 15A. The data $d_0$, $d_2$, $d_1$ and $d_3$ thus latched are outputted from the Q outputs of the the flipflops 151, 153, 152 and 154 to to the internal signal lines 10, 12, 14 and 16, respectively. Accordingly, the data $d_0$, $d_1$, $d_2$ and $d_3$ on the external terminals 20 to 26 are inputted to the internal signal lines 10 to 16, respectively.

Figure 15B:
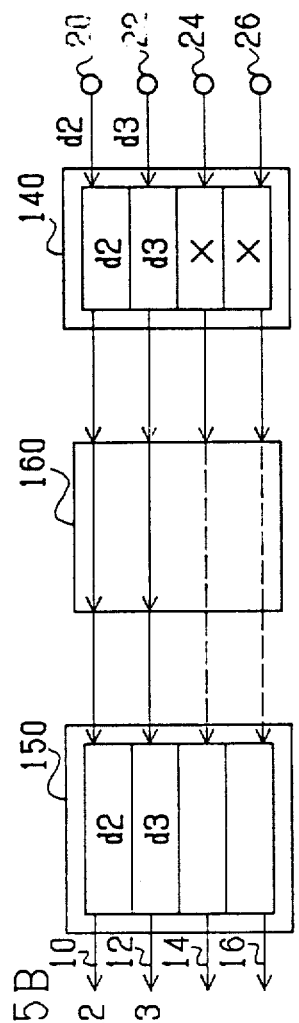
Figure 15C:
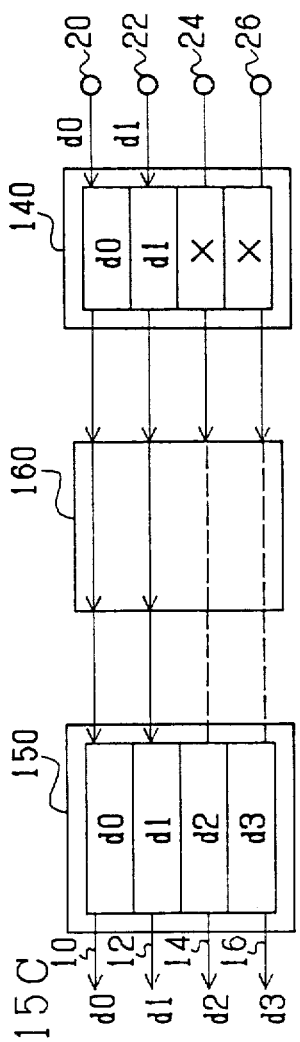

(2) Active mode signal MOD2 (FIGS. 15B and 15C)

When the mode signal MOD2 is made active, the other mode signals MOD4 and MOD1 are inactive. Accordingly, the FET $Q_{190}$, $Q_{191}$, $Q_{192}$ and $Q_{193}$ and the FET $Q_{210}$, $Q_{211}$, $Q_{212}$ and $Q_{213}$ are maintained off and the FET $Q_{200}$, $Q_{201}$, $Q_{202}$ and $Q_{203}$ are turned on. Therefore, the data $d_2$ and $d_3$ inputted to the external terminals 20 and 22 are supplied through the input buffers 141 and 142 to the flipflops 151 and 152. When the clock SCK is rendered active, the flipflops 151 and 152 respectively latch the data $d_2$ and $d_3$, as shown in FIG. 15B. The data $d_2$ and $d_3$ thus latched are outputted from the Q outputs of the the flipflops 151 and 152 to the D inputs of the flipflops 153 and 154 through a path formed of the connection line $L_{93}$ and the FET $Q_{202}$ and another path formed of the connection line $L_{92}$ and the FET $Q_{203}$, respectively.

When the clock SCK is made active after the data $d_2$ and $d_3$ are latched in the the flipflops 151 and 152, the data $d_0$ and $d_1$ are inputted from the external terminals 20 and 22 to to the flipflops 151 and 152. When the clock SCK is rendered active, the flipflops 151 and 152 respectively latch the data $d_0$ and $d_1$, and the flipflops 153 and 154 respectively latch the data $d_2$ and $d_3$ outputted from the Q outputs of the flipflops 151 and 152, as shown in FIG. 15C. Thus, the data $d_0$, $d_2$, $d_1$ and $d_3$ thus latched are outputted from the Q outputs of the the flipflops 151 and 153 to the internal signal lines 10 to 16 in the order of data $d_0$, $d_1$, $d_2$ and $d_3$, as shown in FIG. 9C.

(3) Active mode signal MOD1 (FIGS. 16A, 16B, 16C and 16D)

When the mode signal MOD1 is made active, the other mode signals MOD4 and MOD2 are inactive. Accordingly, the FET $Q_{190}$, $Q_{191}$, $Q_{192}$ and $Q_{193}$ and the FET $Q_{200}$, $Q_{201}$, $Q_{202}$ and $Q_{203}$ are maintained off and the FET $Q_{210}$, $Q_{211}$, $Q_{212}$ and $Q_{213}$ are turned on.

Figure 16A:
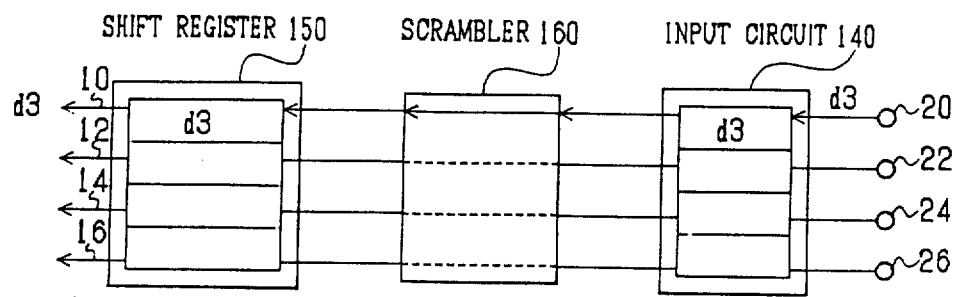
Figure 16B:
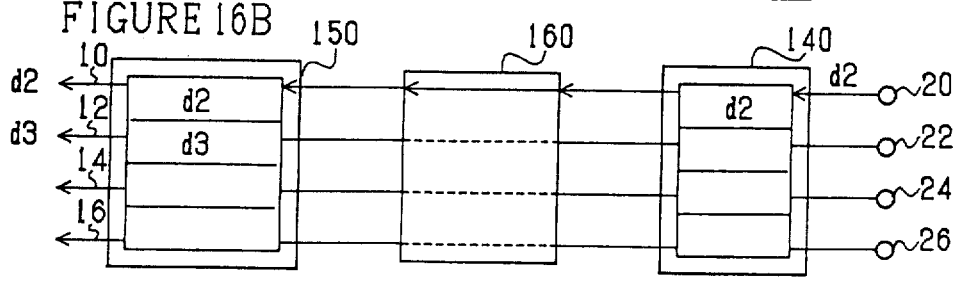
Figure 16C:
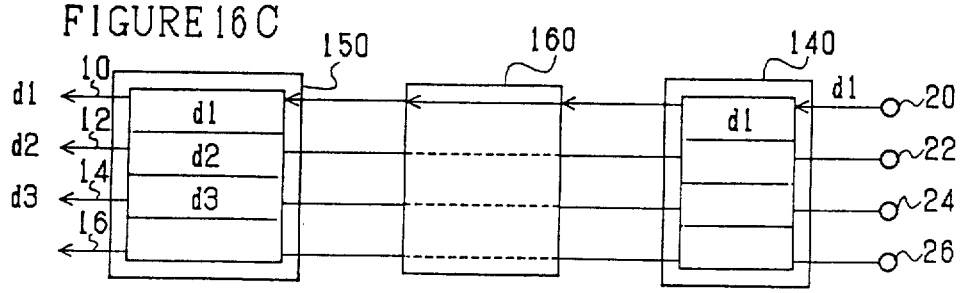
Figure 16D:
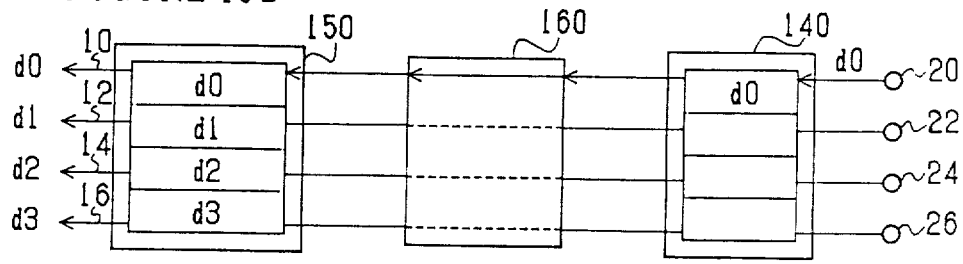

When the data $d_3$ is inputted to the external terminal 20 and the active clock SCK is applied to the four flipflops 151 to 154, the flipflop 151 latches the data $d_3$, as shown in FIG. 16A. At the next clock SCK, the data $d_2$ is inputted to the external terminal 20 so that the flipflop 151 latches the data $d_2$, and the flipflop 152 latches the data $d_3$ outputted from the Q output of the flipflop 151 through the connection line $L_{93}$ and the conducting FET $Q_{211}$, as shown in FIG. 16B. Similarly, at third and fourth clocks SCK, the data $d_1$ and $d_0$ are sequentially inputted to the external terminal 20 so that the flipflop 151 sequentially latches the data $d_1$ and $d_0$. On the other hand, the data latched in the respective flipflops are sequentially shifted. As result, after the four clock SCK, the data $d_0$, $d_1$, $d_2$ and $d_3$ are latched in the the flipflops 151 to 154 and are inputted from the Q outputs of the the flipflops 151 to 154 to the internal signal lines 10 to 16 in the order of data $d_0$, $d_1$, $d_2$ and $d_3$, as shown in FIG. 16D.

When the digital input/output circuit is used in a memory circuit, a high speed operation is demanded, and this demand is gradually increased. For example, it is required to operate with a basic clock of 30 ns. In this case, when the input/output circuit is operated in the serial mode (MOD1) on the basis of the basic clock SCK of 30 ns, the data must be transferred through the data input buffer, shift register, the scrambler and the internal data bus for a very short limited time, and then transmitted to a data register inherent to the memory circuit within a predetermined period of time. The above mentioned second embodiment omits one stage of transfer gate which is one cause for delay, as compared with the first embodiment, so that it makes a high speed operation. Accordingly, the second embodiment can execute all operations which can be performed in the first embodiment, at a speed higher than that of the first embodiment, and with a less number of perts than that required in the first embodiment.

As is apparent from the above explanation of the preferred embodiments of the invention, the input/output circuit in accordance with the present invention is characterized by the provision of the scrambler and the data shifter in the input/output port so that the data processing in the input/output port can be executed in any format of $2^m$. Therefore, the function of the input/output circuit is greatly increased. This is very effective particularly in the case of processing the pixel data in the graphic display technology, since a external circuit including a so-called parallel-to-serial converting shifter can be omitted.

The invention has thus been shown and described with reference to the specific embodiments. However, it should be noted that the present invention is in no way limited to the details of the illustrated structures but changes and modifications may be made within the scope of the appended claims.

We claim:

1. A digital input/output circuit to be connected between a data bus composed of $2^n$ signal lines (n is zero or a positive integer) and $2^n$ external terminals and including an output port for outputting data from said data bus to the external terminals and an input port for inputting the data from the external terminals to said data bus, wherein
   said output port comprises
   scrambler means receiving data of $2^n$ bits from said data bus and a mode signal designating a data transmission bit pattern from a mode signal source and operating for relocating bit positions of received data in accordance with said mode signal so as to output the relocated data with each data unit of $2^m$ bits (m is an integer not greater than n) indicated in a data transmission bit pattern designated by said mode signal,
   output circuit means including $2^n$ output buffers each having an input connected to receive an output of said scrambler means and an output connected to a corresponding one of said external terminals, said output circuit means operating in response to said mode signal so as to make active $2^m$ output buffers of said $2^n$ output buffers in accordance with said mode signal and to make the other output buffers inactive, and
   data shift means connected to said scrambler means and including data latch means for latching data outputted from said scrambler means and shifting the latched data in accordance with said mode signal so that the data of $2^n$ bits is outputted with said each data unit of $2^m$ bits through said active output buffers, and
   said input port comprises
   input circuit means having $2^n$ input buffers connected in their inputs to said external terminals, respectively,
   data shift means including data latch means for receiving the data outputted from said input circuit means so as to latch the data of at least $2^m$ bits in said data latch means in accordance with said mode signal, said data shift means operating to shift the latched data between said data latch means in accordance with said mode signal, and
   scrambler means connected to said data shift means so as to allow data of $2^n$ bits relocated in a bit position in accordance with said mode signal to be outputted to said data bus.

2. A circuit claimed in claim 1 wherein said output port is such that said scrambler means is connected at its input to said data bus and said data shift means is connected between said scrambler means and said output circuit means.

3. A circuit claimed in Claim 1 wherein said output port is such that said data shift means is connected at its input to said data bus and said scrambler means is connected between said data shift means and said output circuit means.

4. A circuit claimed in claim 1 wherein said input port is such that said data shift means is connected at its input to an output of said input circuit means and said scrambler means is connected between said data shift means and said data bus.

5. A circuit claimed in claim 1 wherein said input port is such that said scrambler means is connected at its input to an output of said input circuit means and said data shift means is connected between said scrambler means and said data bus.

6. A digital output signal to be connected between a data bus composed of $2^n$ signal lines (n is zero or a positive integer) and $2^n$ external terminals, comprising:
   scrambler means receiving data of $2^n$ bits from said data bus and a mode signal designating a data transmission bit pattern from a mode signal source and operating for relocating bit positions of received data in accordance with said mode signal so as to output the relocated data with each data unit of $2^m$ bits (m is an integer not greater than n) indicated in a data transmission bit pattern designated by said mode signal,
   output circuit means including $2^n$ output buffers each having an input connected to receive an output of said scrambler means and an output connected to a corresponding one of said external terminals, said output circuit means operating in response to said mode signal so as to make active $2^m$ output buffers of said $2^n$ output buffers in accordance with said mode signal and to make the other output buffers inactive, and data means connected to said scrambler means and including data latch means for latching data outputted from said scrambler means and shifting the latched data in accordance with said mode signal so that the data of $2^n$ bits is outputted with said each data unit of $2^m$ bits through said active output buffers.

7. A digital input circuit to be connected between a data bus composed of $2^n$ signal lines (n is zero or a positive integer) and $2^n$ external terminals, including:

input circuit means having $2^n$ input buffers connected at their inputs to said external terminals, respectively, data shift means including data latch means for receiving the data outputted from said input circuit means so as to latch the data of at least $2^m$ bits in said data latch means in accordance with a mode signal designating a data transmission bit pattern, said data shift means operating to shift the latched data between said data latch means in accordance with said mode signal, and scrambler means connected to said data shift means so as to allow data of $2^n$ bits relocated in a bit position in accordance with said mode signal to be outputted to said data bus.

* * * * *